(12) United States Patent
Iwashita et al.

(10) Patent No.: US 9,745,428 B2
(45) Date of Patent: Aug. 29, 2017

(54) METHOD FOR PROCESSING RESIN PRODUCT AND RESIN PRODUCT

(71) Applicant: CANON COMPONENTS, INC., Kodama-gun, Saitama-ken (JP)

(72) Inventors: Taisuke Iwashita, Kodama-gun (JP); Yoshihisa Negishi, Kodama-gun (JP); Yoshihiro Hattori, Kodama-gun (JP); Naoki Tatebayashi, Kodama-gun (JP)

(73) Assignee: CANON COMPONENTS, INC., Saitama (JP)

( * ) Notice: Subject to any disclaimer, the term of this patent is extended or adjusted under 35 U.S.C. 154(b) by 384 days.

(21) Appl. No.: 14/455,324

(22) Filed: Aug. 8, 2014

(65) Prior Publication Data
US 2015/0044425 A1 Feb. 12, 2015

(30) Foreign Application Priority Data

Aug. 9, 2013 (JP) .................. 2013-167026
Mar. 25, 2014 (JP) .................. 2014-062695

(51) Int. Cl.
| | | |
|---|---|---|
| C08F 2/46 | (2006.01) | |
| C08F 2/50 | (2006.01) | |
| C08G 61/04 | (2006.01) | |
| C08J 3/28 | (2006.01) | |
| H05K 1/03 | (2006.01) | |
| H05K 3/18 | (2006.01) | |
| C08J 7/12 | (2006.01) | |
| C23C 18/16 | (2006.01) | |
| C23C 18/20 | (2006.01) | |
| H05K 3/38 | (2006.01) | |
| C23C 18/48 | (2006.01) | |

(52) U.S. Cl.
CPC .......... *C08J 3/28* (2013.01); *C08J 7/123* (2013.01); *C23C 18/1608* (2013.01); *C23C 18/1612* (2013.01); *C23C 18/1641* (2013.01); *C23C 18/204* (2013.01); *C23C 18/2006* (2013.01); *H05K 1/032* (2013.01); *H05K 3/182* (2013.01); *H05K 3/185* (2013.01); *C08J 2345/00* (2013.01); *C23C 18/2086* (2013.01); *C23C 18/48* (2013.01); *H05K 3/381* (2013.01); *H05K 2203/107* (2013.01); *Y10T 428/24612* (2015.01); *Y10T 428/31692* (2015.04)

(58) Field of Classification Search
CPC .......... C08J 3/28; C08J 2345/00; C08J 7/123; H05K 3/182; H05K 1/032; H05K 3/381; H05K 3/185; H05K 2203/107; C23C 18/1608; C23C 18/1641; C23C 18/204; C23C 18/286; C23C 18/1612; C23C 18/2006; C23C 18/48
USPC ................ 522/160, 157, 150, 1, 161; 520/1
See application file for complete search history.

(56) References Cited

U.S. PATENT DOCUMENTS

| | | | |
|---|---|---|---|
| 2011/0064889 A1* | 3/2011 | Osamura .............. | C23C 18/204 427/553 |
| 2015/0124040 A1* | 5/2015 | Kanome ............ | G03G 15/6529 347/139 |
| 2015/0289384 A1* | 10/2015 | Iwashita ................ | H05K 3/185 174/250 |
| 2015/0361560 A1* | 12/2015 | Iwashita ................ | H05K 3/185 428/201 |
| 2015/0376794 A1* | 12/2015 | Iwashita ............. | C23C 18/1608 428/209 |
| 2016/0177452 A1* | 6/2016 | Iwashita ............. | C23C 18/1612 428/201 |
| 2016/0186324 A1* | 6/2016 | Iwashita ................ | H05K 3/185 428/457 |
| 2016/0186325 A1* | 6/2016 | Iwashita ................ | H05K 1/032 174/250 |

FOREIGN PATENT DOCUMENTS

| | | |
|---|---|---|
| JP | 04-183873 A | 6/1992 |
| JP | 06-087964 A | 3/1994 |
| JP | 06-256548 A | 9/1994 |
| JP | 07-116870 A | 5/1995 |
| JP | 07-240568 A | 9/1995 |
| JP | 08-180757 A | 7/1996 |
| JP | 08-253869 A | 10/1996 |
| JP | 2000-114695 A | 4/2000 |
| JP | 2004-273707 A | 9/2004 |
| JP | 2005-243991 A | 9/2005 |
| JP | 2008-094923 A | 4/2008 |
| JP | 2012-136769 A | 7/2012 |

OTHER PUBLICATIONS

Kim et al, Vacuum ultraviolet induced surface modification of cyclo-olefin polymer substrates for photochemical activation bonding, Oct. 15, 2008, Applied Surface Science, 255, 3648-3654.*

* cited by examiner

*Primary Examiner* — Jessica E Whiteley
(74) *Attorney, Agent, or Firm* — Rossi, Kimms & McDowell LLP

(57) ABSTRACT

There is provided with a method for manufacturing a resin product. One embodiment includes performing a modification process on a portion of a surface of the resin product not less than two times by different methods to modify the portion such that a plating metal can be deposited on the portion.

20 Claims, 14 Drawing Sheets

F I G. 3
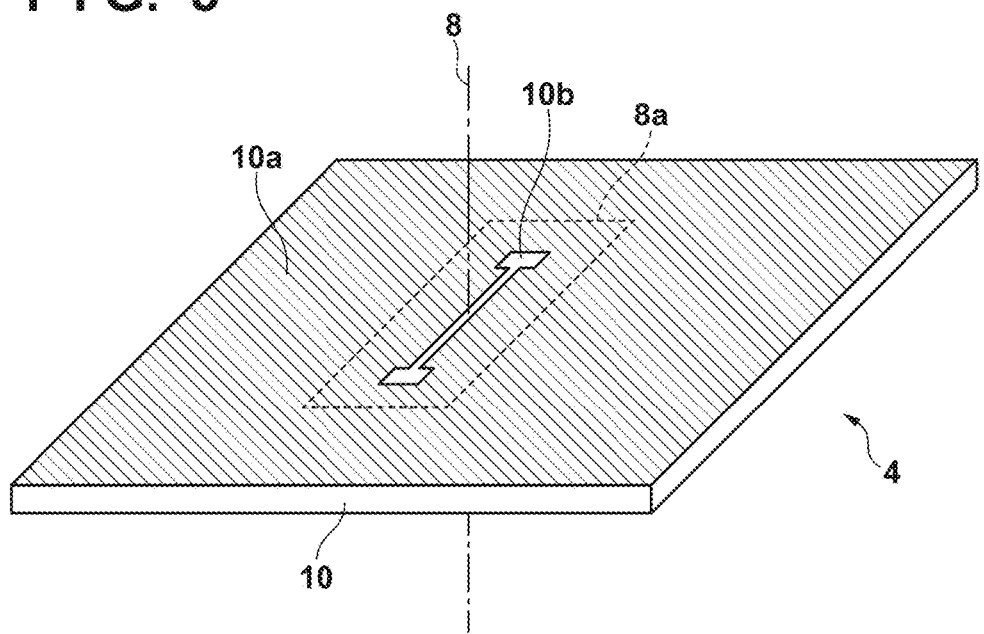
F I G. 4
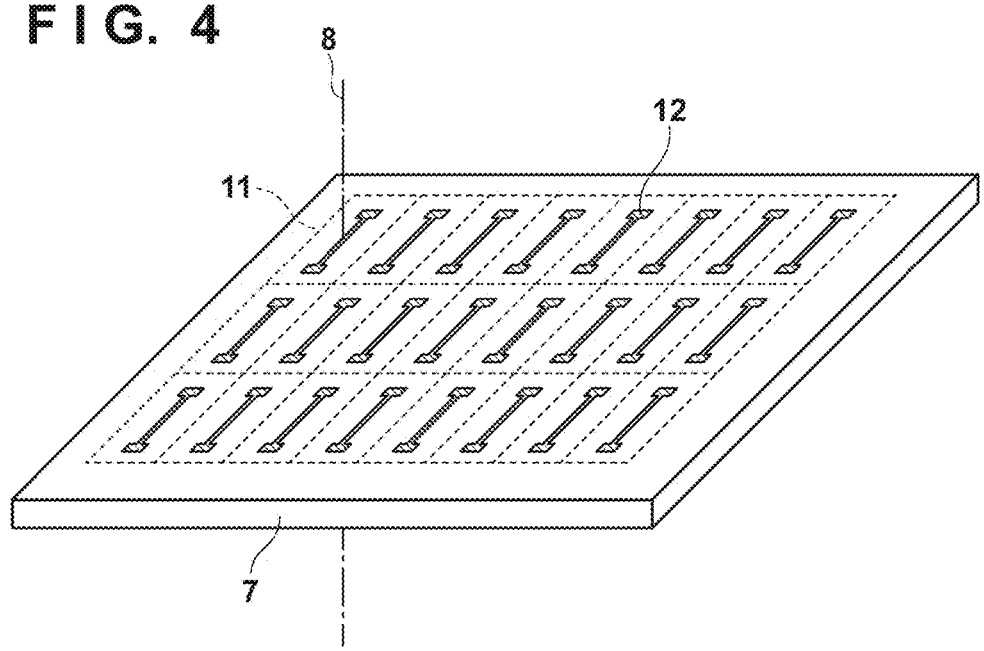

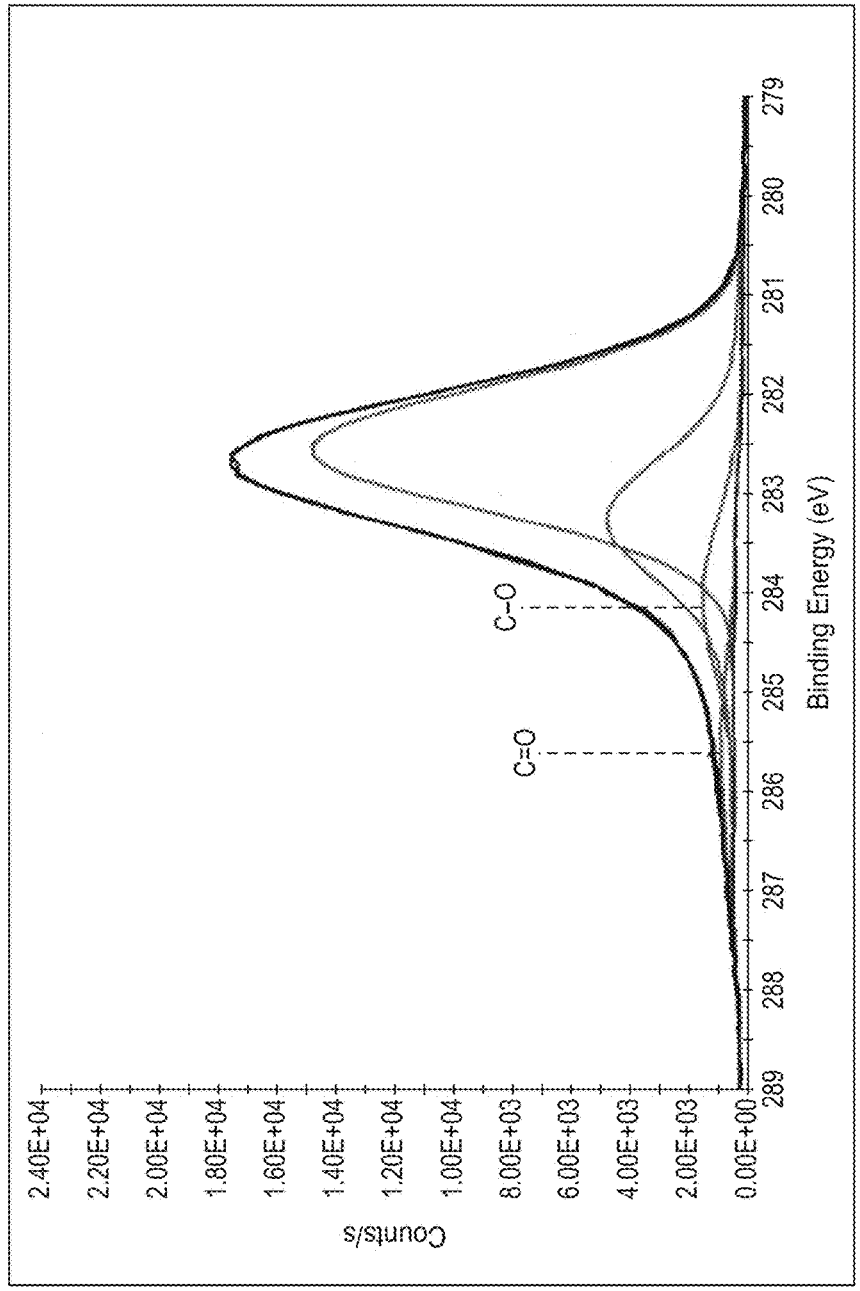

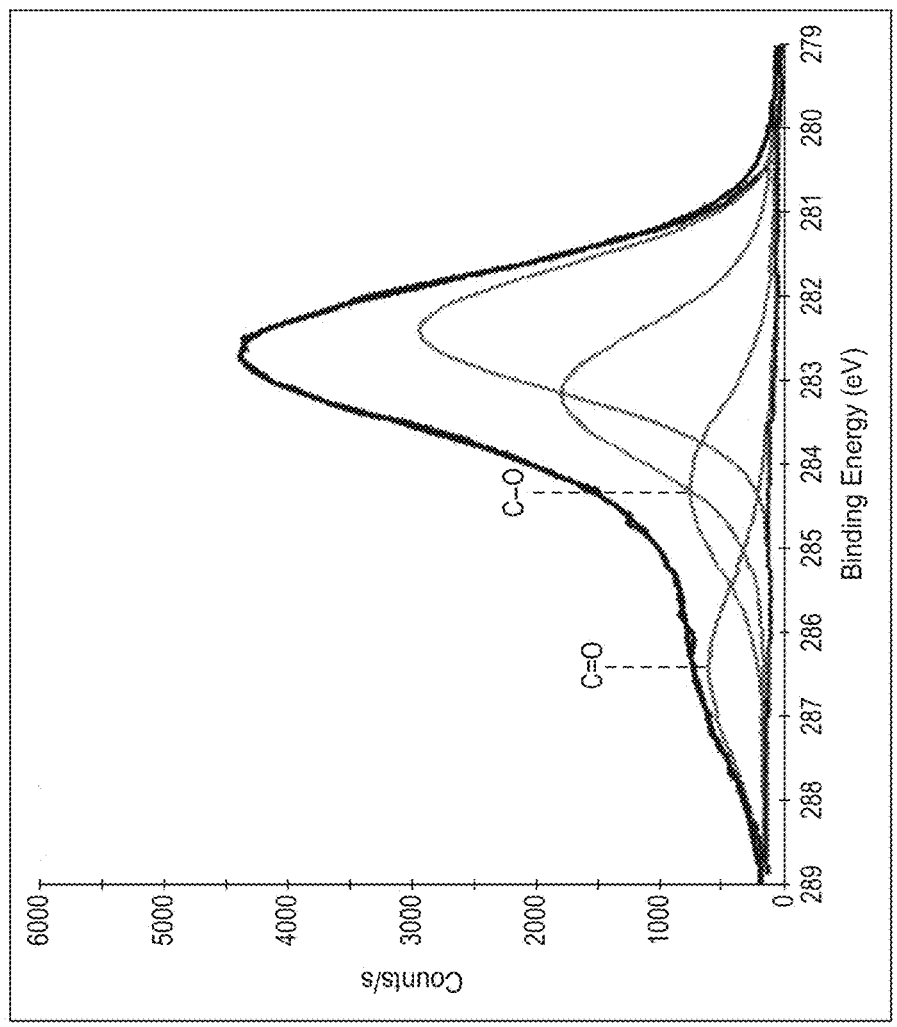

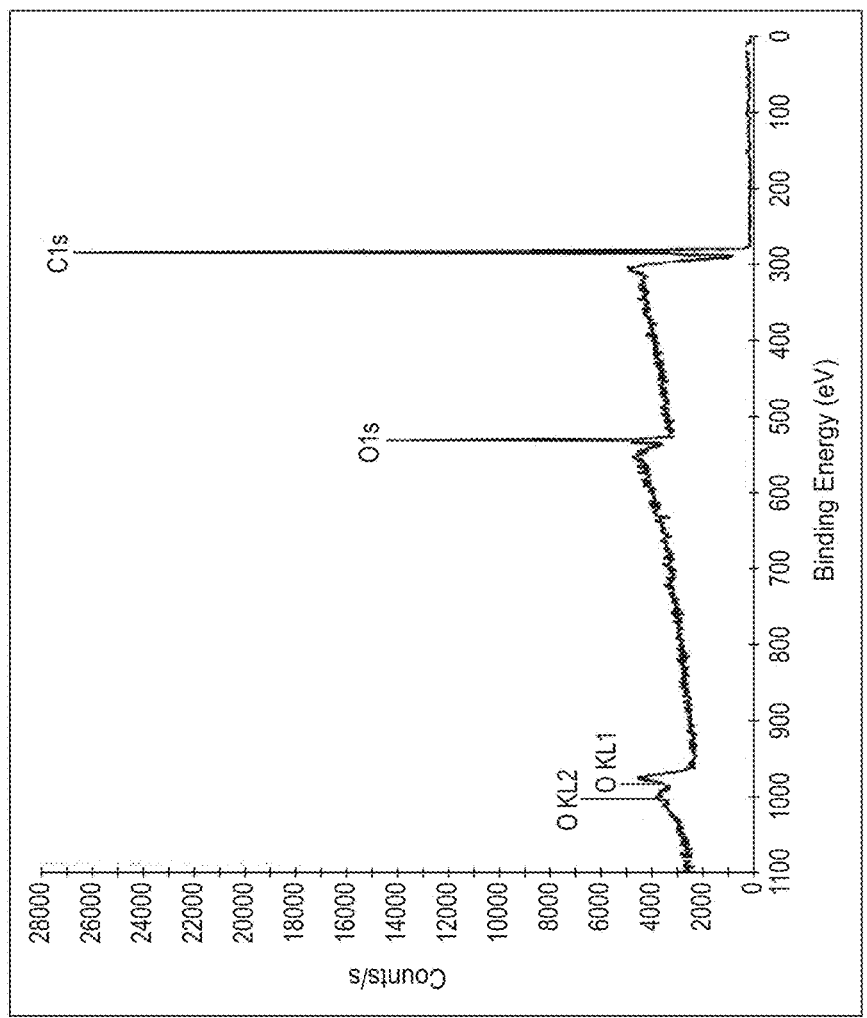

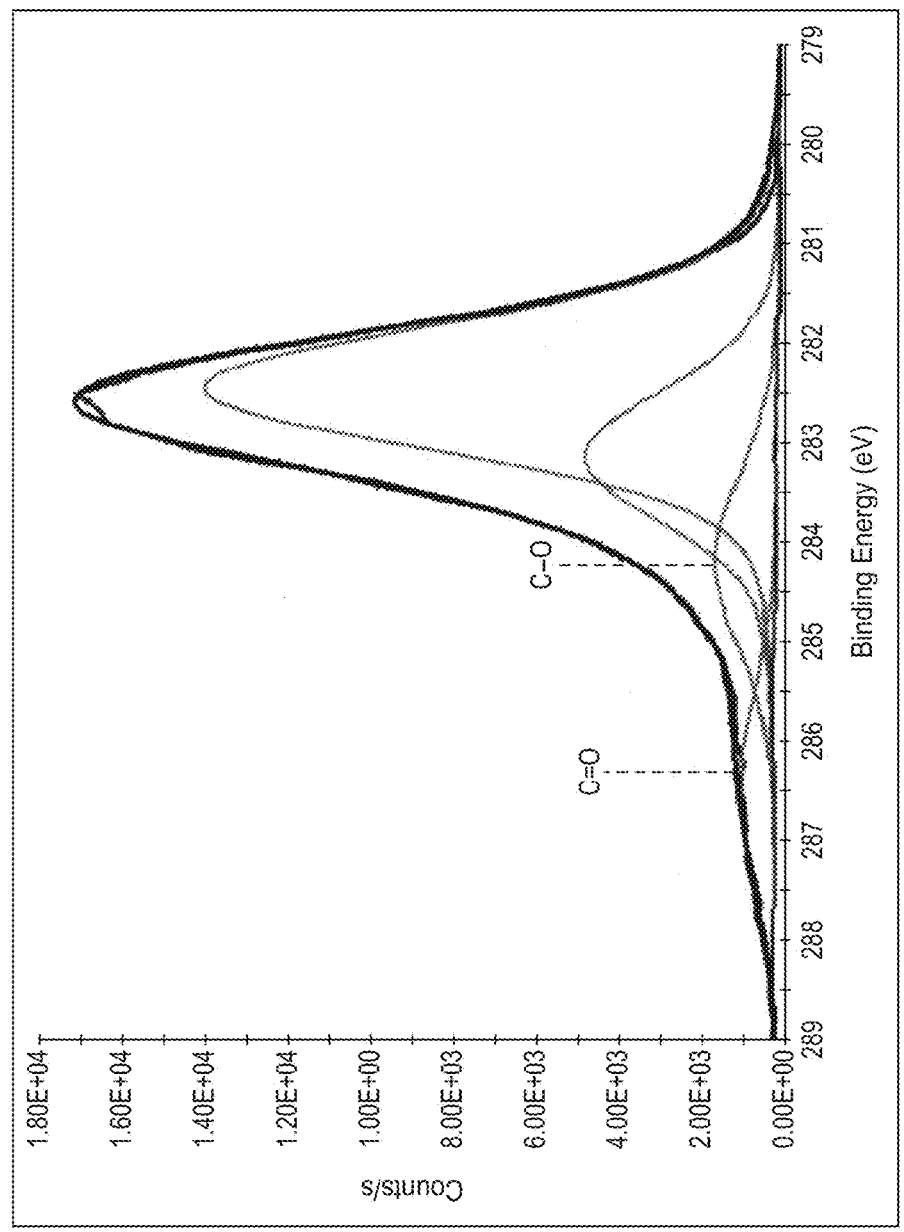

METHOD FOR PROCESSING RESIN PRODUCT AND RESIN PRODUCT

BACKGROUND OF THE INVENTION

Field of the Invention

The present invention relates to method for processing resin product and resin product, and more particularly, to a method for forming a metal film on a resin product.

Description of the Related Art

A circuit board including a resin product and a metal film formed on the resin product and having a predetermined pattern is known. A plating method is an example of a method for forming the metal film on the resin product. In an ordinary plating method, a substrate surface is roughened in order to improve adhesion. Since a signal in a high-frequency region flows near a conductor surface due to a skin effect, a signal loss increases in plating in which a metal is deposited along a roughened surface having large projections and recesses.

Japanese Patent Laid-Open No. 2008-094923 has disclosed a printed circuit board manufacturing method using surface modification by ultraviolet light. More specifically, surface modification necessary for electroless plating is first performed by irradiating the whole surface of a cycloolefin polymer material with ultraviolet lamp. Then, a metal film is formed by performing electroless plating on the whole modified surface of the cycloolefin polymer material, and the obtained material is used as the material of a printed circuit board.

SUMMARY OF THE INVENTION

According to one embodiment, a method for processing a resin product comprises performing a modification process on a portion of a surface of the resin product not less than two times by different methods to modify the portion such that a plating metal can be deposited on the portion.

According to another embodiment, a resin product with a metal film is manufactured by a method comprises: performing a modification process on a portion of a surface of the resin product not less than two times by different methods to modify the portion such that a plating metal can be deposited on the portion; and plating the resin product on which the modification process is performed to manufacture the resin product with the metal film.

According to still another embodiment, a resin product comprises a metal film on a surface of one portion of the resin product which is recessed from a surface of another portion of the resin product adjacent to the one portion.

According to yet another embodiment, a method for processing a resin product comprises: irradiating the portion with an ultraviolet laser having a wavelength of not more than 243 nm; and oxidizing a region including the portion after the irradiating to modify the portion such that a plating metal can be deposited on the portion.

Further features of the present invention will become apparent from the following description of exemplary embodiments (with reference to the attached drawings).

BRIEF DESCRIPTION OF THE DRAWINGS

FIG. 3 is a schematic view of a photomask to be used in an irradiation step.

FIG. 4 is a schematic view of a resin product irradiated with an ultraviolet laser in the irradiation step.

FIG. 5D is a view showing the XPS measurement result of the resin product surface after being modified by the ultraviolet laser.

FIG. 8B is a view showing the XPS measurement result of the resin product surface after the laser-irradiated portion is additionally irradiated with the ultraviolet lamp.

FIG. 9A is a view showing the XPS measurement result of the resin product surface after a portion not irradiated with the laser is irradiated with an ultraviolet lamp.

FIG. 9B is a view showing the XPS measurement result of the resin product surface after the portion not irradiated with the laser is irradiated with the ultraviolet lamp.

DESCRIPTION OF THE EMBODIMENTS

When manufacturing a printed circuit board by the method described in Japanese Patent Laid-Open No. 2008-094923, a photolithography step and etching step are necessary, so the method requires a high cost and long time. In addition, the environmental load is high because a large amount of waste liquid is produced.

According to one embodiment of the present invention, a fine metal wiring pattern can be formed on a resin product with a low cost.

Embodiments applicable to the present invention will be explained below with reference to the drawings. However, the scope of the present invention is not limited to the following embodiments.

The present inventors knew the technique of irradiating the surface of a cycloolefin polymer material with ultraviolet light from an ultraviolet lamp through a quartz chromium mask or metal mask on which a desired pattern is formed, by applying the technique described in patent literature 1. In this technique, it is possible to selectively modify a portion on the cycloolefin polymer material, which corresponds to the desired pattern, and selectively deposit a plating metal on this portion without performing a photolithography step and etching step. When using this technique, the surface need not largely be roughened, so it is possible to suppress a high-frequency signal loss and reduce the number of steps.

The present inventors, however, have found that the method of performing selective modification by emitting ultraviolet light from an ultraviolet lamp through a mask poses the following problems.

(1) Irradiation with the ultraviolet lamp requires a long irradiation time until the surface is modified to such an extent that a plating metal is deposited.

(2) The temperatures of the mask and substrate rise during ultraviolet lamp irradiation. Since the mask and substrate generally have different thermal expansion coefficients, portions to be irradiated are misaligned with the elapse of time. This influence becomes significant as the fineness of a pattern increases.

For example, a case in which a material obtained by forming an ultraviolet-shielding chromium film having a desired pattern on the surface of ultraviolet-transmitting synthetic quartz is used as a photomask will be explained below. When the photomask is irradiated with an ultraviolet lamp, the photomask and a resin product are heated by heat generated by the lamp itself. In one embodiment, the temperatures of the photomask and resin product exceed 50° C. when they are irradiated with ultraviolet light for 12 min. In this state, the synthetic quartz and resin product expand at different ratios due to the difference between the thermal expansion coefficients of the synthetic quartz and resin product.

For example, the thermal expansion coefficients of the synthetic quartz and a cycloolefin polymer material are as follows.

Synthetic quartz: $0.06 \times 10^{-5}$ (ASAHI GLASS, AQ)
Cycloolefin polymer material: $6 \times 10^{-5}$ (ZEON, ZF-16)

Figure 1:
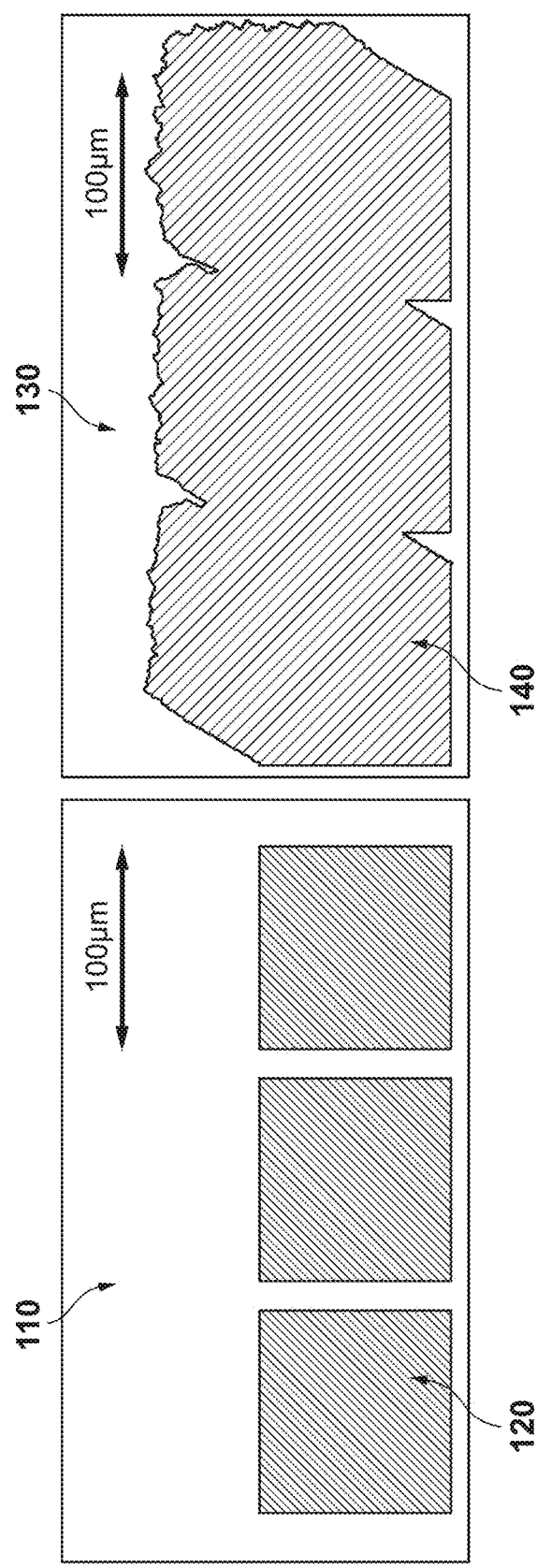
FIGS. 1A and 1B are views showing a misaligned electroless plating pattern.

During irradiation with the ultraviolet lamp, therefore, the relative positions of the pattern on the synthetic quartz and the resin product are misaligned. As a consequence, a pattern obtained by plating is not formed in a desired position. FIG. 1B shows a plating metal deposition status when a photomask shown in FIG. 1A is attached to a cycloolefin polymer material, the surface is modified by emitting ultraviolet light from an ultraviolet lamp, and electroless copper plating is performed. FIGS. 1A and 1B show synthetic quartz 110, chromium 120, a cycloolefin polymer material 130, and a copper plating deposited portion 140. This misalignment may pose a problem especially when forming a wiring with a fine pattern in μm-order.

The present inventors made extensive studies to place the ultraviolet lamp apart from the mask in order to prevent the temperature rises of the mask and resin product, and have found that the modification efficiency decreases. The present inventors thought that this is because ultraviolet light having a short wavelength useful to modification is readily absorbed by oxygen in the air, so the effective irradiation distance is short. Also, the present inventors made extensive studies to cool the mask and resin product by using a cooling device, and have found that the time required for modification prolongs.

The present inventors further made extensive studies to momentarily modify the resin product surface by using an ultraviolet laser having an energy density higher than that of the ultraviolet lamp. In this case, however, a surface modification amount necessary for plating was not obtained. In this specification, the amount of oxygen atoms newly introduced to the resin product surface will be called a "surface modification amount".

The present inventors have found that the above-described problems can be solved by modifying the resin product surface by combining two or more different modification methods, instead of modifying the resin product surface by using one modification method. That is, a plating metal can be deposited in only a desired region by combining a first modification process capable of modifying only the desired region with accuracy higher than that of a second modification process, and the second modification process capable of obtaining a modification amount larger than that of the first modification process. Thus, a method of manufacturing a resin product whose surface is partially modified in accordance with one embodiment of the present invention includes a modification step of performing a modification process on the portion of the surface twice or more by using different methods. This method can form a fine metal wiring pattern on a resin product with a low cost.

In one embodiment of the present invention, the modification step includes an irradiation step of modifying the surface of a resin product by irradiating a portion of the resin product with ultraviolet light, and an oxidation step of modifying the surface by performing an oxidation process on a region including the portion of the resin product. That is, in one embodiment of the present invention, the irradiation step of irradiating a desired portion of a resin product with ultraviolet light and the oxidation step of performing an oxidation process on a region including the desired portion are performed. For example, when using a combination of an ultraviolet lamp and ultraviolet laser in modification, a desired portion of a resin product can selectively be modified while suppressing the misalignment of a pattern to be formed. Each step of this embodiment will be explained in detail below. In the embodiment to be explained below, the oxidation step is performed after the irradiation step.

In the embodiment to be explained below, a resin product in which a portion of the surface is modified, that is, a resin product in which a desired portion to be plated is modified, is manufactured. More specifically, a desired portion to be plated is selectively modified by ultraviolet irradiation. A resin product with a metal film can be manufactured by a plating process of performing plating on the resin product having the modified desired portion, thereby selectively plating the desired portion. The method of this embodiment makes it possible to omit a photolithography step and etching step. That is, the method of this embodiment is advantageous in cost, time, and environmental load because the processing steps and waste can be reduced.

When ultraviolet light is emitted, oxygen in the ambient is decomposed, and ozone is generated. Also, bonds in molecules forming the resin are broken on the resin surface. In this state, the molecules forming the resin react with the ozone, thereby oxidizing the resin surface, that is, forming a C—O bond, C=O bond, C(=O)—O bond (a skeleton of a carboxyl group), and the like on the resin surface. Hydrophilic groups like these increase the chemical adsorption between the resin product and a plating layer. In addition, the oxidation of the resin product surface forms a fine roughened surface, and increases physical adsorption to the plating layer by an anchoring effect. Furthermore, when performing electroless plating, catalyst ions can selectively be adsorbed to the modified portion. Consequently, the irradiated portion can selectively be plated.

(Resin Product)

A resin product to be used in this embodiment is not particularly limited as long as the product has, on the surface, a resin material which can be modified such that a plating metal is selectively deposited on a portion irradiated with ultraviolet light in the irradiation step. Examples of the resin material are a cycloolefin polymer, polystyrene, and polyethylene terephthalate. In one embodiment, the resin material is a carbon polymer formed by carbon atoms and hydrogen atoms, and the carbon polymer includes a cycloolefin polymer. The cycloolefin polymer can be, for example, a polymer having a repeating unit indicated by:

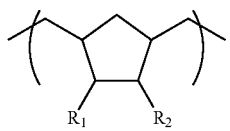

In the above formula, $R_1$ and $R_2$ each independently represent a hydrogen atom or a hydrocarbon group having 1 to 12 carbon atoms. This hydrocarbon group includes, for example, an alkyl group having 1 to 12 carbon atoms. Examples of the alkyl group are a methyl group, ethyl group, and cyclohexyl group. In one embodiment, each of $R_1$ and $R_2$ is a divalent hydrocarbon group having 1 to 12 carbon atoms. This divalent hydrocarbon group includes, for example, a divalent alkyl group having 1 to 12 carbon atoms. Examples of the divalent alkyl group are a 1,3-propanediyl group, 1,3-cyclopentanediyl group, and 5-methylcyclopentane-1,3-diyl group. An example of the cycloolefin polymer is a polymer having one of repeating units A to E below.

In this embodiment, the resin product is a substrate formed into a planar shape. However, the resin product can have an arbitrary three-dimensional shape. Also, the resin product need not be formed by a resin alone. That is, in one embodiment, the resin product is a composite material having a coated structure obtained by coating the surface of another material with a resin material. A practical example of this composite material is a material obtained by coating the surface of a metal material with a resin material. The shape of this metal material is not particularly limited, and can be a substrate-like shape or more complicated three-dimensional shape.

Examples of the method of coating another material with the resin material are as follows.

The resin material is dissolved in an organic solvent, and another material is dipped in the solution.

The resin material is thermally melted, and another material is dipped in the molten resin material.

The resin material is dissolved in an organic solvent, and the solution is sprayed on another material, thereby coating the other material with the solution.

The resin material is thermally melted, and applied to another material with a brush.

A powder of the resin material is fluidized by the air, and another heated material is dipped in the fluidized powder. (Fluidized-bed coating)

| | A | B | C | D | E |
|---|---|---|---|---|---|
| Properties | | | | | |
| Transparency | Crystalline | Amorphous | Amorphous | Amorphous | Amorphous |
| Tg/° C. | Opaque | Transparent | Transparent | Transparent | Transparent |
| | 134 | 86 | 95 | 150 | 162 |

The cycloolefin polymer may also contain a plurality of repeating units. Also, the resin material may contain a plurality of cycloolefin polymers. The glass transition temperature (Tg) can be adjusted by mixing a plurality of cycloolefin polymers having different Tg's. The cycloolefin polymer to be used in one embodiment is obtained by mixing cycloolefin polymers having any of the above-mentioned repeating units A to E, and its Tg is 160° C. This cycloolefin polymer is mainly formed by a cycloolefin polymer having the above-mentioned repeating unit E.

The cycloolefin polymer indicated by the above formula is formed by carbon atoms and hydrogen atoms. The cycloolefin polymer according to one embodiment is a chemically highly stable substance. The weight-average molecular weight of the cycloolefin polymer is not particularly limited, and is $1 \times 10^4$ (inclusive) to $1 \times 10^6$ (inclusive) in one embodiment.

In one embodiment, the resin product has a smooth surface. As the surface smoothness of the resin product improves, the uniformity of a film to be formed by plating improves. In one embodiment, an arithmetic average roughness Ra of the resin product surface is 10 nm or less. In this specification, the arithmetic average roughness Ra is defined by JIS B0601:2001.

The resin material and another material are electrified by using a direct current with a high voltage, thereby coating the other material with the resin material. (Electrostatic coating)

A sol-like resin material is adhered to another preheated material by dipping the latter into the former, and thermally cured by gel curing after that. (Dipping)

A powdery resin material is attracted by supplying electricity to another material. (Electrostatic fluidized-bed coating)

However, the coating method is not limited to the above-described methods. An appropriate method can be selected in accordance with the characteristics of the resin material to be used and the characteristics of another material to be coated.

Before another material is coated with the resin material, roughness, i.e., projections and recesses, may be formed on the surface of the other material in order to improve the physical adhesion by the anchoring effect. It is also possible to coat the surface of another material with a primer before the other material is coated with the resin material, in order to improve the chemical adhesion.

(Irradiation Step)

In the irradiation step, a desired portion of the resin product is irradiated with ultraviolet light. By this ultraviolet irradiation, the surface of the resin product is oxidized as described above, and as a consequence the resin product surface is modified. As the ultraviolet light to be emitted, light having a high energy density is used so as to be able to modify the resin product surface to some extent within a short time. In one embodiment, the energy density at the main wavelength of the ultraviolet light to be emitted is $1.0 \times 10^5$ W/cm$^2$ or more. The upper limit of the energy density is not particularly limited, and can be, for example, $1.0 \times 10^{15}$ W/cm$^2$ or less. In the following description, the main wavelength is a wavelength having the highest intensity in a region of 243 nm or less. The main wavelength of a single-wavelength laser is the wavelength of the laser.

In one embodiment, an ultraviolet laser is used as the ultraviolet light to be emitted. The type and wavelength of the ultraviolet laser are not particularly limited, and are so selected as to promote the modification of the resin product surface. In one embodiment, the wavelength of the ultraviolet laser is 243 nm or less. When the wavelength is 243 nm or less, the modification of the resin product surface is further promoted. The following explanation will be made by assuming that the ultraviolet laser is emitted in the irradiation step.

The ultraviolet laser has high-density energy compared to ultraviolet light from an ultraviolet lamp. Therefore, a certain surface modification amount can be obtained within a short time. When irradiation is thus performed within a short time, thermal expansion of the resin product is mostly suppressed, so a pattern can accurately be formed on the resin product. One embodiment uses an ultraviolet pulse laser by which a high energy density is readily obtained.

In one embodiment, an excimer laser is used as the ultraviolet laser. The excimer laser is a kind of a gas laser. More specifically, an excited state is generated by instantaneously applying a high voltage to a gas mixture of an inert gas and halogen gas, thereby performing high-output pulse oscillation. The excimer laser can modify the resin product surface within a minimum time without increasing thermal expansion.

The laser wavelength changes in accordance with a combination of the inert gas and halogen gas to be used to generate an excimer laser. The relationship between the gas combination and laser wavelength is as follows.

$F_2$ excimer laser: wavelength=157 nm

ArF excimer laser: wavelength=193 nm

KrCl excimer laser: wavelength=222 nm

In one embodiment, an ArF excimer laser is used as the ultraviolet laser. Since the ArF excimer laser has a relatively short wavelength, the resin product surface is more efficiently modified. Also, the ArF excimer laser is easy to handle because the laser is absorbed by the air lesser than an $F_2$ excimer laser.

In one embodiment, a desired portion of the resin product is irradiated with the excimer laser in the form of a pulse. Thermal expansion of the resin product can be suppressed by emitting the pulsed laser for a short time period. In one embodiment, the pulse width is 10 (inclusive) to 100 (inclusive) ns. A high-intensity pulse laser is obtained by reciprocating laser light in an optical resonator, and extracting the laser light when a certain time has elapsed.

The laser beam from the excimer laser can have a rectangular beam shape of, for example, about 20×10 mm, which reflects the shape of a discharge region. Since the beam is thick and the pulse energy is high, a relatively large area can be processed at once with a relatively high irradiation intensity when using the excimer laser. As will be described later, a desired modification pattern can be formed on the resin product by inserting, into an excimer laser optical system, a photomask having a mask pattern corresponding to the shape of a desired portion to be plated.

In one embodiment, the resin product is irradiated with the ultraviolet laser, or the ultraviolet light, in an atmosphere containing at least one of oxygen or ozone. As a practical example, the resin product is irradiated with the ultraviolet laser in the atmosphere. In another embodiment, irradiation is performed in an ozone-containing ambient in order to further promote modification.

In still another embodiment, the resin product can also be irradiated with the ultraviolet laser in another gas ambient such as a nitrogen ambient or ammonia ambient. When irradiation is performed in the nitrogen ambient or ammonia ambient, it is possible to oxidize the resin surface, that is, generate bonds containing nitrogen atoms on the resin surface. More specifically, the resin surface is so modified as to contain nitrogen atoms, and the adsorption to a plating layer improves, so the irradiated portion can selectively be plated.

Even when the resin product is not a planar substrate but has a three-dimensional shape, it is possible to fit a mask having a desired pattern on the resin product, and emit the ultraviolet laser from above the mask. In one embodiment, a thin metal plate having a desired hole pattern is used as a mask, and the metal plate is bent so as to be fitted on the resin product having a three-dimensional shape. Consequently, the three-dimensional resin product can selectively be irradiated with the ultraviolet laser. As another method, the ultraviolet laser can be emitted while directly scanning a desired portion to be plated on the resin product in accordance with a desired pattern.

When the resin product is irradiated with the laser, a recess is formed in the laser-irradiated portion. That is, the resin product surface in this laser-irradiated portion is recessed from the resin product surface adjacent to the irradiated portion. The depth of the recess can be controlled by changing the irradiation amount. More specifically, the higher the laser energy density and the larger the number of pulses, the deeper the recess becomes. In a plating step (to be described later), a metal film is formed in this recess. By thus forming the metal film in the recess, it is possible to make the obtained metal film physically difficult to peel.

(Irradiation Apparatus)

Figure 2:
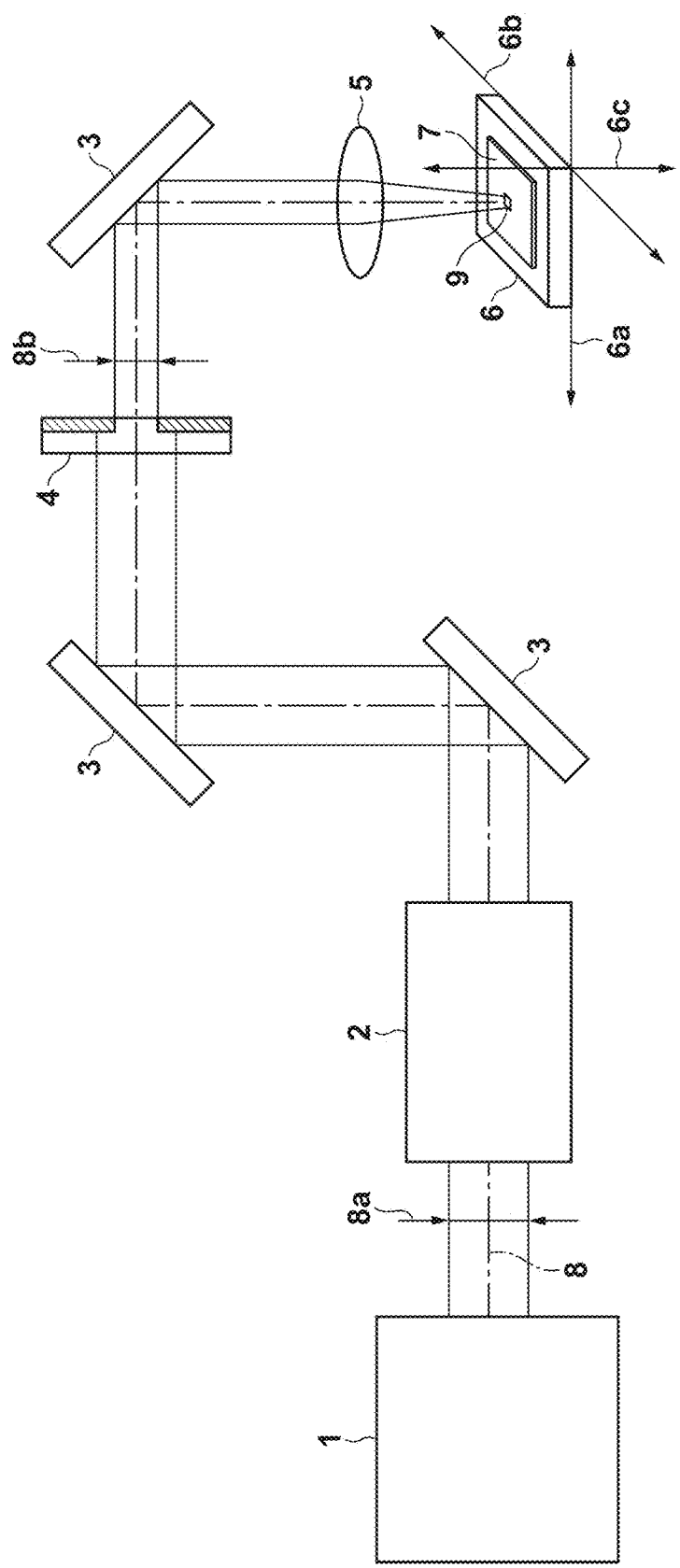
FIG. 2 is a schematic view showing the arrangement of an ultraviolet laser irradiation apparatus.

An example of an irradiation apparatus to be used in the irradiation step will be explained below with reference to a schematic configuration view of FIG. 2. A laser oscillator 1 generates an ultraviolet laser 8 having a size indicated by a beam size 8a. The ultraviolet laser 8 is guided to an attenuator 2 (a reducer) arranged on a beam optical axis 8 of the ultraviolet laser 8, and reduced to have a desired pulse energy. The obtained pulse energy can be confirmed by installing a power/energy sensor on the beam optical axis of the ultraviolet laser 8 as needed.

The reduced laser beam is guided via an optical system 3 to a photomask 4 installed on the beam optical axis of the ultraviolet laser 8. Although not shown in FIG. 2, in one embodiment, the laser beam is guided to the photomask 4 having a mask pattern after the laser beam intensity in a plane is uniformized by a homogenizer.

FIG. 3 shows details of the photomask 4. A material capable of transmitting an ultraviolet laser is used as a substrate 10 of the photomask. For example, when using an ultraviolet laser having a wavelength of 193 nm, an example of the substrate material is synthetic quartz. A light-shielding member 10a suited to shield an ultraviolet laser is formed on the surface of the substrate 10. An example of the light-shielding member 10a is a chromium film. The light-shielding member 10a has an opening 10b. The opening 10b has a shape corresponding to a desired metal film pattern to be formed on the resin product. In this embodiment, the opening 10b has a size falling within the range of the beam size 8a. In one embodiment, the photomask 4 has a plurality of openings 10b.

The laser beam is formed into a desired pattern shape through the opening 10b. The ultraviolet laser 8 having a laser beam pattern 8b thus shaped enters a projection lens 5 installed on the beam optical axis of the ultraviolet laser 8. The ultraviolet laser 8 transmitted through the projection lens 5 is projected at a desired magnification on a resin product 7. Thus, a portion 9 to be processed on the resin product 7 is modified. In this step, the position of a work stage 6 is adjusted in a Z moving direction 6c so that the surface position of the resin product 7 placed on the work stage 6 matches the focusing position of the projection lens 5.

In one embodiment as described above, the surface of the resin product 7 is modified by using ozone. In this embodiment, oxygen exists between the projection lens 5 and resin product 7.

FIG. 4 shows details of the modified resin product 7. The ultraviolet laser 8 reduced by the projection lens 5 is projected onto portions 12 on the surface of the resin product 7, thereby forming modified portions. Each modified portion is formed within a range 11 which can be modified by performing laser irradiation once, on the resin product 7 placed on the work stage 6. Also, a plurality of modified portions can be formed on the resin product 7 by performing laser irradiation while moving the work stage on which the resin product 7 is placed in an X moving direction 6a and Y moving direction 6b.

(Oxidation Step)

Then, an oxidation process is performed on the resin product irradiated with ultraviolet light such as the ultraviolet laser 8 in the irradiation step. More specifically, the oxidation process is performed in a region including the desired portion to be plated. As described previously, no plating metal is deposited in this desired portion on the resin surface by only irradiating the desired portion with ultraviolet light such as the ultraviolet laser 8. In the oxidation step, therefore, the resin product surface is further modified by performing the oxidation process in a broader range including the desired portion irradiated with the ultraviolet light in the irradiation step. This oxidation process is performed such that in a portion irradiated with the laser, the surface modification amount increases to such an extent that a plating metal is deposited, and in a portion not irradiated with the laser, the surface modification amount is suppressed to such an extent that no plating metal is deposited.

Practical examples of the oxidation process are a photoexcited ashing process, a plasma ashing process, an oxidation process using a chemical, and an oxidation process using ultraviolet irradiation. In the following description, the method using ultraviolet light which can easily be performed will be explained. More specifically, the resin product is further modified when irradiated with ultraviolet light in an ambient containing, for example, oxygen, ozone, nitrogen, or ammonia as in the irradiation step. In one embodiment, the resin product is irradiated with the ultraviolet light in an atmosphere containing at least one of oxygen or ozone. In this method, the ultraviolet light is applied to a region including the desired portion to be plated. Especially in one embodiment, the ultraviolet light is applied to a region including the desired portion to be plated and wider than the desired portion. That is, in the oxidation step, it is not essential to limit the portion to be irradiated with ultraviolet light by using a mask.

In one embodiment, ultraviolet light having a wavelength of 243 nm or less is emitted. The modification of the resin product surface is further promoted because the wavelength is 243 nm or less. This ultraviolet light can be emitted by using, for example, an ultraviolet lamp or ultraviolet LED which continuously radiates ultraviolet light. The energy density of the ultraviolet light to be emitted is not particularly limited as long as the modification progresses. For example, the energy density can be $1.0 \times 10^{-3}$ W/cm$^2$ or more, and can also be $1.0 \times 10^2$ W/cm$^2$ or less. In the oxidation step, the irradiation time need not be limited to a short time. Accordingly, the energy density of the ultraviolet light to be used in the oxidation step can be lower than that of the ultraviolet light to be used in the irradiation step.

Examples of the ultraviolet lamp are a low-pressure mercury lamp and excimer lamp. The low-pressure mercury lamp can emit ultraviolet light having wavelengths of 185 and 254 nm. As reference, examples of the excimer lamp usable in the atmosphere will be presented below. An Xe$_2$ excimer lamp is generally used as the excimer lamp.

Xe$_2$ excimer lamp: wavelength=172 nm

KrBr excimer lamp: wavelength=206 nm

KrCl excimer lamp: wavelength=222 nm

In the oxidation step of this embodiment, the desired portion to be plated is already modified by using the ultraviolet laser. Therefore, the irradiation time of the ultraviolet lamp in the oxidation step can be shorter than that when modifying the resin product without using the ultraviolet laser.

When irradiating the resin product with the ultraviolet light, the ultraviolet irradiation is controlled so that the irradiation amount has a desired value. The irradiation amount can be controlled by changing the irradiation time. The irradiation amount can also be controlled by changing, for example, the output of the ultraviolet lamp, the number of ultraviolet lamps, or the irradiation distance. A practical irradiation amount will be described later.

The plating metal deposition conditions can change in accordance with, for example, the type of plating solution, the type of substrate, the degree of contamination on the substrate surface, the concentration, temperature, and deterioration with time of the plating solution, the output fluctuation of the ultraviolet lamp, and defocusing of the excimer laser. In this case, it is only necessary to appropriately determine the irradiation amount from the ultraviolet lamp with reference to the above-mentioned numerical values, so that a plating metal is selectively deposited on the laser-irradiated portion.

(Oxidation Apparatus)

Figure 7:
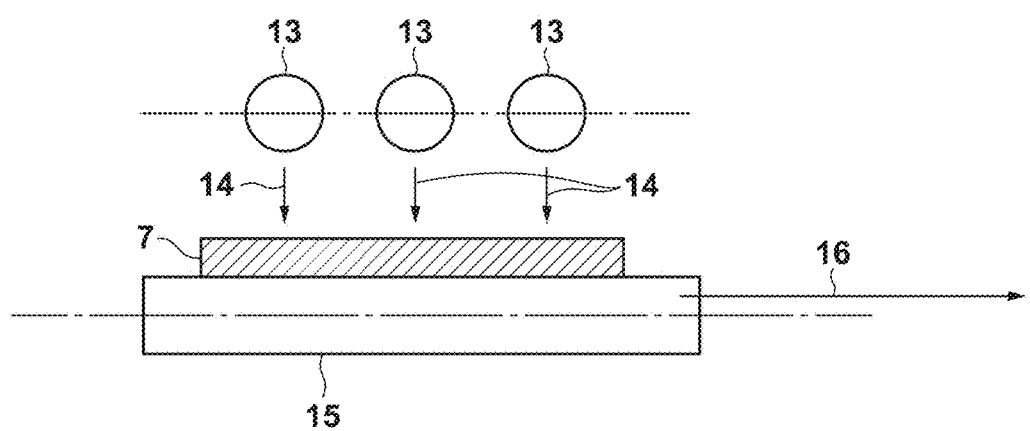
FIG. 7 is a schematic view showing the arrangement of an ultraviolet irradiation apparatus to be used in an oxidation step.

An example of an ultraviolet irradiation apparatus to be used in the oxidation step will be explained below with reference to a schematic configuration view of FIG. 7. Ultraviolet lamps 13 emit ultraviolet light 14 having a predetermined energy. The ultraviolet light 14 irradiates the resin substrate 7. In one embodiment as described above, the surface of the resin product 7 is modified by using ozone. In this embodiment, oxygen exists between the ultraviolet lamps 13 and resin product 7.

In one embodiment, the resin substrate 7 is fixed immediately below the ultraviolet lamps 13, and irradiated with the ultraviolet light 14. In another embodiment, the resin substrate 7 is fixed on a conveyance stage 15, and irradiated with the ultraviolet light 14 while the conveyance stage 15 is moved in a conveyance direction 16 at a desired velocity.

In still another embodiment, the resin substrate 7 is irradiated with the ultraviolet light 14 while the resin substrate 7 itself is moved at an arbitrary velocity.

(Irradiation Amount)

The ultraviolet irradiation amount in the irradiation step and the ultraviolet irradiation amount in the oxidation step are so adjusted that a plating metal is deposited in a portion irradiated with the ultraviolet light in the irradiation step, and no plating metal is deposited in a portion not irradiated with the ultraviolet light in the irradiation step. To realize this deposition state, in one embodiment, the ultraviolet irradiation amount in the irradiation step is adjusted such that in a portion to be irradiated with the ultraviolet light in the irradiation step, the oxygen atom existence ratio on the cycloolefin polymer material surface is 3.0% or more, or 3.8% or more, after the irradiation step. The hydrophilicity of the resin surface is largely influenced by the ratio of carbon atoms to oxygen atoms, but the influence of the existence of hydrogen atoms is probably smaller. Therefore, the existence of hydrogen atoms is not included in the calculation of the oxygen atom existence ratio but ignored.

In one embodiment, to deposit a plating metal, the ultraviolet irradiation amount in the oxidation step is adjusted so that in a portion irradiated with the ultraviolet light in the irradiation step, the oxygen atom existence ratio is 18% or more, or 20.1% or more, after the oxidation step. The oxygen atom existence ratio has no upper limit as long as the plating metal deposits. Also, to deposit no plating metal, the ultraviolet irradiation amount in the oxidation step is adjusted so that in a portion not irradiated with the ultraviolet light in the irradiation step, the oxygen atom existence ratio is 15% or less, or 12.6% or less, after the oxidation step. The oxygen atom existence ratio has no lower limit as long as the plating metal does not deposit.

In this specification, the oxygen atom existence ratio is the existence ratio (at %) of oxygen atoms to all atoms, which is calculated by XPS measurement. However, the number of hydrogen atoms is not included in this calculation because XPS measurement cannot detect hydrogen atoms. Also, the oxygen atom existence ratio may slightly change due to, for example, the measurement conditions or a detection error of each apparatus.

In one embodiment, to deposit no plating metal in a portion not irradiated with the ultraviolet light in the irradiation step, the ultraviolet irradiation amount in the oxidation step is set at 400 mJ/cm$^2$ or less at the main wavelength (for example, 185 nm for a low-pressure mercury lamp). The ultraviolet irradiation amount and irradiation intensity indicate values at the main wavelength hereinafter unless otherwise specified. In one embodiment in which the ultraviolet irradiation intensity in the oxidation step is 1.35 mW/cm$^2$, the ultraviolet irradiation time in the oxidation step is set to 5 min or less so as not to deposit a plating metal in a portion not irradiated with the ultraviolet light in the irradiation step.

Also, in one embodiment in which the oxygen atom existence ratio in a portion irradiated with the ultraviolet light in the irradiation step is 6.5% or more, or 7.1% or more, after the irradiation step, the ultraviolet irradiation amount in the oxidation step is set at 65 mJ/cm$^2$ or more, or 81 mJ/cm$^2$ or more, so as to deposit a plating metal in the portion irradiated with the ultraviolet light in the irradiation step. In one embodiment in which the ultraviolet irradiation intensity in the oxidation step is 1.35 mW/cm$^2$, the ultraviolet irradiation time in the oxidation step is set to 0.8 min or more, or 1 min or more, so as to deposit a plating metal in a portion irradiated with the ultraviolet light in the irradiation step. For example, when using ultraviolet light having an energy density of 80 (inclusive) to 150 (inclusive) mJ/cm$^2$, or about 100 mJ/cm$^2$, in the irradiation step, ultraviolet light having an irradiation amount complying with the above-mentioned conditions can be emitted in the oxidation step.

Furthermore, in one embodiment in which the oxygen atom existence ratio in a portion irradiated with the ultraviolet light in the irradiation step is 3.0% or more, or 3.8% or more, after the irradiation step, the ultraviolet irradiation amount in the oxidation step is set at 200 mJ/cm$^2$ or more, or 243 mJ/cm$^2$ or more, so as to deposit a plating metal in the portion irradiated with the ultraviolet light in the irradiation step. In one embodiment in which the ultraviolet irradiation intensity in the oxidation step is 1.35 mW/cm$^2$, the ultraviolet irradiation time in the oxidation step is set to 2.5 min or more, or 3 min or more, so as to deposit a plating metal in a portion irradiated with the ultraviolet light in the irradiation step. For example, when using ultraviolet light having an energy density of 800 (inclusive) to 1,500 (inclusive) mJ/cm$^2$, or 1,000 mJ/cm$^2$, in the irradiation step, ultraviolet light having an irradiation amount complying with the above-mentioned conditions can be emitted in the oxidation step.

In one embodiment, when ultraviolet light is emitted in the irradiation step so that the oxygen atom existence ratio in a portion irradiated with the ultraviolet light in the irradiation step is 6.5% or more, or 7.1% or more, after the irradiation step, the ultraviolet irradiation time in the subsequent oxidation step can be shortened. In one embodiment, when using ultraviolet light having an energy density of 80 (inclusive) to 150 (inclusive) mJ/cm$^2$, or 100 mJ/cm$^2$, in the irradiation step, the ultraviolet irradiation time in the subsequent oxidation step can be shortened.

The oxygen atom existence ratio which is obtained after the irradiation step in a portion irradiated with the ultraviolet light in the irradiation step can be controlled by adjusting the energy density of the ultraviolet light in the irradiation step. More specifically, within the range of 100 to 1,000 mJ/cm$^2$, the oxygen atom existence ratio tends to decrease as the energy density increases. Also, the oxygen atom existence ratio after the oxidation step can be controlled by adjusting the ultraviolet irradiation amount in the oxidation step. More specifically, the oxygen atom existence ratio tends to increase as the ultraviolet irradiation amount in the oxidation step increases.

The above-described irradiation amount is particularly effective when performing electroless copper-nickel plating in a plating step. However, even when using a different plating solution or the like, the irradiation amounts in the irradiation step and oxidation step can be adjusted based on these findings. That is, the irradiation amounts in the irradiation step and oxidation step can be adjusted in accordance with, for example, the resin product and the composition of the plating solution, such that a plating metal is deposited in a portion irradiated with the ultraviolet light in the irradiation step, and no plating metal is deposited in a portion not irradiated with the ultraviolet light in the irradiation step.

(Plating Step)

Subsequently, a metal film is formed on the surface of the resin product, which is modified in the oxidation step. A metal film formation method includes plating. In this embodiment, a plating metal is selectively deposited on a portion having a desired pattern and irradiated with the ultraviolet light in the irradiation step. That is, a plating metal is deposited on a portion irradiated with the ultraviolet light in the irradiation step, and is not deposited on a portion adjacent to the portion irradiated with the ultraviolet light in the irradiation step. Therefore, it is not essential to pattern the metal film by a method such as photolithography or etching after the metal film is formed.

In one embodiment, a metal film is formed by electroless plating. A practical electroless plating method is not particularly limited. Examples of an adoptable electroless plating method are an electroless plating method using a formalin-based electroless plating bath, and an electroless plating method using hypophosphorous acid having a low deposition rate as a reducing agent. Other practical examples of the electroless plating method are electroless nickel plating, electroless copper plating, and electroless copper-nickel plating. Performing the above-mentioned irradiation step and oxidation step improves the adhesion between the resin product and the electroless plating layer deposited by any of these methods.

In one embodiment, electroless plating can be performed by the following method.

1. A resin product is degreased by dipping it in an alkaline solution, thereby increasing the hydrophilicity.
2. The resin product is dipped in a solution containing a binder such as a cation polymer which binds the resin product and catalyst ions.
3. The resin product is dipped in a solution containing the catalyst ions.
4. The resin product is dipped in a solution containing a reducing agent, thereby reducing and depositing the catalyst ions.
5. A plating metal is deposited on the deposited catalyst.

In another embodiment, a metal film can be formed by a high-speed electroless plating method. The high-speed electroless plating method can form a thicker plating film. In still another embodiment, a plating metal is further deposited by electroplating on a metal film formed by electroless plating. This method can form a still thicker metal film. A practical electroplating method is not particularly limited.

The thickness of the obtained metal film is not particularly limited. A metal film having an appropriate thickness is formed in accordance with the application of a resin product with a metal film to be obtained. Also, the material of the metal film is not particularly limited. An appropriate material is selected in accordance with the application of a resin product with a metal film to be obtained.

The resin product with a metal film thus obtained can be used in various applications. In particular, a resin product with a metal film obtained by forming a copper-film pattern on the surface of a resin product by electroless plating is suited to be used as a circuit board by increasing the thickness of the metal film as needed. A cycloolefin polymer with a metal film particularly has good high-frequency characteristics because a cycloolefin polymer has a high electrical insulation and low dielectric constant, and the interface between the metal film and cycloolefin polymer is relatively flat. Accordingly, the cycloolefin polymer with a metal film can be used in place of a circuit board using a fluorine-resin substrate.

In one embodiment, a nanometer-level fine roughened surface is formed on the resin product modified in the irradiation step and oxidation step. In one embodiment, the surface roughness (arithmetic average roughness) Ra of the resin product in a portion irradiated with the ultraviolet light in the irradiation step is 100 nm or less. In the description below, the surface roughness Ra of the resin product in a portion irradiated with the ultraviolet light in the irradiation step denotes the surface roughness Ra after the pretreatment for the plating. The inventors found that the surface roughness changes in the pretreatment for the plating including dipping in the alkaline solution (alkaline processing) and dipping in the binder solution (conditioner step). In other words, the surface roughness on the resin product is formed by the irradiation step, the oxidation step, and the pretreatment for the plating. Therefore, the surface roughness Ra of the resin product after the pretreatment for the plating reflects the roughness of the interface between the metal film and resin product. More specifically, the surface roughness Ra of the resin product in a portion irradiated with the ultraviolet light in the irradiation step can be the surface roughness Ra after resin product is dipped in a solution containing a binder. Further, the surface roughness Ra of the resin product in a portion irradiated with the ultraviolet light in the irradiation step can be the surface roughness Ra before the resin product is dipped in a solution containing the catalyst ions. The surface roughness Ra is 20 nm or less in another embodiment, 10 nm or less in still another embodiment, and 5 nm or less in still another embodiment. The high-frequency characteristics of the circuit board can be improved when the surface roughness Ra is 100 nm or less.

In this embodiment, a desired plating pattern can be formed on the resin product without using photolithography and etching. Especially when using a combination of high-energy-density ultraviolet irradiation and the oxidation process, it is possible to prevent a modification misalignment deriving from the difference between the thermal expansion coefficients of the resin substrate and mask, and a plating misalignment caused by this modification misalignment. This makes it possible to form a plating pattern with a higher accuracy. Accordingly, this embodiment can form a fine plating pattern. Also, modification can be performed to some extent within a short time by high-energy-density ultraviolet irradiation. Therefore, it is possible to form, for example, a circuit board within a short time at a low cost. Furthermore, the environmental load can be reduced because wastes can be reduced. In this embodiment as described above, a fine plating pattern can be formed within a short time at a low cost with a low environmental load.

EXAMPLES

XPS Measurement

In the following explanation, the oxygen atom amount supplied to the resin product surface was measured by XPS analysis. The measured oxygen atom amount indicates the degree of progress of surface modification. Theta Probe manufactured by Thermo Fisher Scientific was used as an XPS analyzer. As an excitation X-ray, a monochromatic X-ray using Al as a target (Al Kα 148 6.6 eV) was used. In the measurement, an electron beam and argon ions were emitted in order to neutralize electrification. Table 1 shows the analysis conditions.

TABLE 1

| | X-ray Beam Diameter (µm) | Step Energy (eV) | Pulse Energy (eV) |
| --- | --- | --- | --- |
| Qualitative Analysis | 300 | 1 | 200 |
| Composition Analysis | 300 | 0.1 | 100 |

[Modification by Ultraviolet Lamp]

Table 2 shows the results of analysis of an electroless plating metal deposition status and a surface modification status obtained by XPS (X-ray Photoelectron Spectroscopy)

measured when a resin product was irradiated with ultraviolet light by using a low-pressure mercury lamp as an ultraviolet light source. More specifically, a cycloolefin polymer material (Zeonor Film ZF-16 manufactured by ZEON, film thickness=100 μm, and surface roughness=1.01 nm) was irradiated with ultraviolet light from the low-pressure mercury lamp for a predetermined time, and XPS measurement was performed. As the low-pressure mercury lamp, the same lamp as used in Example 1 (to be described later) was used. The output of the low-pressure mercury lamp was 1.35 mW/cm² at a wavelength of 185 nm. In addition, electroless plating was performed on the irradiated resin product in the same manner as in a plating step of Example 1 (to be described later).

In "Electroless Plating Metal Deposition Status" in Table 2, ○ indicates that a plating metal was deposited, x indicates that no plating metal was deposited, and Δ indicates that a plating metal was partially deposited. Also, "Oxygen Atom Existence Ratio" indicates the ratio (at %) of oxygen atoms to all atoms measured by XPS measurement. "Oxygen Atoms (%) of C—O Bond" indicates the ratio (at %) of oxygen atoms forming a C—O bond to all atoms measured by XPS measurement. "Oxygen Atoms (%) of C=O Bond" indicates the ratio (at %) of oxygen atoms forming a C=O bond to all atoms measured by XPS measurement. In this case, "Oxygen Atom Existence Ratio"="Oxygen Atoms (%) of C—O Bond"+"Oxygen Atoms (%) of C=O Bond".

pulse, and XPS measurement was performed. As the ArF excimer laser, the same laser as used in Example 1 (to be described later) was used. Items shown in Table 3 are the same as those shown in Table 2. In addition, electroless plating was performed on the irradiated resin product in the same manner as in the plating step of Example 1 (to be described later).

TABLE 3

|  | Number of Pulses | | | |
| --- | --- | --- | --- | --- |
|  | 0 | 2 | 10 | 20 |
| Plating Metal Deposition Status | x | x | x | x |
| Oxygen Atom Existence Ratio (%) | 0 | 3.8 | — | 4.1 |
| Oxygen Atoms in C—O Bond (%) | 0 | 2.6 | — | 2.5 |
| Oxygen Atoms in C=O Bond (%) | 0 | 1.2 | — | 1.6 |

As shown in Table 3, the oxygen atom existence ratio was almost constant at about 4% even when the number of pulses was changed, that is, the number of pulses and the surface modification amount were not proportional. Also, no electroless plating metal was deposited under any conditions. This was so probably because the surface modified by the

TABLE 2

|  | Irradiation Time of Low-Pressure Mercury Lamp | | | | | |
| --- | --- | --- | --- | --- | --- | --- |
|  | 0 min | 1 min | 2 min | 3 min | 4 min | 12 min |
| Cumulative Irradiation Amount (185 nm, 1.35 mW/cm²) | 0 mJ/cm² | 81 mJ/cm² | 162 mJ/cm² | 243 mJ/cm² | 324 mJ/cm² | 972 mJ/cm² |
| Plating Metal Deposition Status | x | x | x | x | x | ○ |
| Oxygen Atom Existence Ratio (%) | 0.0 | 12.6 | — | — | 13.6 | 23.2 |
| Oxygen Atoms in C—O Bond (%) | 0.0 | 8.2 | — | — | 7.8 | 10.0 |
| Oxygen Atoms in C=O Bond (%) | 0.0 | 4.4 | — | — | 5.8 | 13.2 |

As shown in Table 2, an electroless plating metal was not deposited when the cumulative irradiation amount was 324 mJ/cm² or less, and was deposited when the cumulative irradiation amount was 972 mJ/cm² or more. Also, the XPS measurement results demonstrate that the electroless plating metal was not deposited when the oxygen atom existence ratio on the resin product surface was 13.6% or less, and was deposited when this ratio was 23.2% or more. Furthermore, an irradiation time of about 10 min was necessary.

[Modification by Laser]

Table 3 shows the results of analysis of an electroless plating metal deposition status and a surface modification status obtained by XPS measurement when a resin product was irradiated with an ArF excimer laser. More specifically, a cycloolefin polymer material (Zeonor Film ZF-16 manufactured by ZEON, film thickness=100 μm, and surface roughness=1.01 nm) was irradiated with a predetermined number of pulses of the ArF excimer laser (main wavelength=193 nm) at an energy density of 1,000 mJ/cm² per laser was ablated, that is, the modified portion was removed by the laser. "Ablation" herein mentioned is to remove a material by locally evaporating the material on the material surface by a method such as locally raising the temperature of the surface by applying an intense laser.

Table 4 shows the results of analysis of an electroless plating metal deposition status and a surface modification status obtained by XPS measurement when the energy density per pulse of the ArF excimer laser was 100 mJ/cm². The rest of the conditions were the same as in Table 3.

TABLE 4

|  | Number of Pulses | | | |
| --- | --- | --- | --- | --- |
|  | 0 | 20 | 100 | 200 |
| Plating Metal Deposition Status | x | x | x | x |

TABLE 4-continued

| | Number of Pulses | | | |
|---|---|---|---|---|
| | 0 | 20 | 100 | 200 |
| Oxygen Atom Existence Ratio (%) | 0 | 7.3 | — | 8.7 |
| Oxygen Atoms in C—O Bond (%) | 0 | 4.5 | — | 5.8 |
| Oxygen Atoms in C=O Bond (%) | 0 | 2.8 | — | 2.9 |

As shown in Table 4, the oxygen atom existence ratio was almost constant at about 8% even when the number of pulses was changed, that is, the number of pulses and the surface modification amount were not proportional. Also, no electroless plating metal was deposited under any conditions. However, the oxygen existence amount increased from that when the energy density per pulse was 1,000 $mJ/cm^2$. This was so perhaps because the modified surface was not extensively removed by ablation when the energy density of the laser was low.

[Formation of Recess by Laser Irradiation]

A cycloolefin polymer material (Zeonor Film ZF-16 manufactured by ZEON, film thickness=100 μm, and surface roughness=1.01 nm) was irradiated with an ArF excimer laser (main wavelength=193 nm) at an energy density of 100 or 1,000 $mJ/cm^2$ per pulse. As the ArF excimer laser, the same laser as used in Example 1 (to be described later) was used. After that, the depth of a recess formed in the laser-irradiated portion was measured by using a stylus step profiler (Alpha-Step manufactured by Yamoto Scientific). The measurement was performed near the central portion (the second measurement) and near the two end portions (the first and third measurements) in the laser incidence range. Table 5 shows the measurement results.

TABLE 5

| Number of Pulses | Cumulative Irradiation Amount | 1st Measurement | 2nd Measurement | 3rd Measurement |
|---|---|---|---|---|
| Energy Density Per Pulse: 100 $mJ/cm^2$ | | | | |
| 20 pulses | 2000 $mJ/cm^2$ | Immeasurable (No Irradiation Mark Was Found) | | |
| 100 pulses | 10000 $mJ/cm^2$ | 1517 Å | 3547 Å | 1723 Å |
| 200 pulses | 20000 $mJ/cm^2$ | 1427 Å | 1708 Å | 2859 Å |
| Energy Density Per Pulse: 1000 $mJ/cm^2$ | | | | |
| 2 pulses | 2000 $mJ/cm^2$ | 1801 Å | 3009 Å | 1754 Å |
| 10 pulses | 10000 $mJ/cm^2$ | 11221 Å | 11604 Å | 9411 Å |
| 20 pluses | 20000 $mJ/cm^2$ | 24802 Å | 20615 Å | 22704 Å |

As shown in Table 5, when the laser energy density was higher, a deeper recess was formed. Also, the cumulative irradiation amount and depth were almost proportional when the laser energy density was 1,000 $mJ/cm^2$. However, when the laser energy density was 100 $mJ/cm^2$, the depth did not largely change even when the cumulative irradiation amount was increased. This was so presumably because the physical properties changed when the material surface was modified, and the ablation effect decreased especially when the energy density was low.

As described above, a recess was formed in the resin product surface by laser irradiation. Also, it was possible to control the depth of the recess by controlling the energy density and irradiation amount of the laser.

[Measurement of Surface Roughness]

First, a cycloolefin polymer material (Zeonor Film ZF-16 manufactured by ZEON, film thickness=100 μm, and surface roughness=1.01 nm) was irradiated with one pulse of an ArF excimer laser (main wavelength=193 nm) at an energy density of 2,000 $mJ/cm^2$ per pulse. After that, the cycloolefin polymer material was irradiated with ultraviolet light from a low-pressure mercury lamp for 3 min and 30 sec. As the low-pressure mercury lamp, the same lamp as in Example 1 (to be described below) was used. The output of the low-pressure mercury lamp was 1.35 $mW/cm^2$ at a wavelength of 185 nm. Then, the alkaline process and the conditioner step as described in the Example 1 below are performed. Thereafter, the arithmetic average roughness Ra of the portion, which was irradiated with the laser and the ultraviolet light from the low-pressure mercury lamp, of the cycloolefin polymer modified as described above was measured. As a consequence, the arithmetic average roughness Ra was 4 nm.

Example 1

Substrate Processing

In Example 1, a cycloolefin polymer material (Zeonor Film ZF-16 manufactured by ZEON, film thickness=100 μm, and surface roughness=1.01 nm) as a resin material was used as a substrate for electroless plating.

First, the following processes were performed to clean the substrate surface before surface modification was performed.

1. Ultrasonic cleaning with pure water at 50° C. for 3 min
2. Dipping in an alkaline cleaning solution (containing 3.7% of sodium hydroxide) at 50° C. for 3 min
3. Ultrasonic cleaning with pure water at 50° C. for 3 min
4. Drying (Irradiation Step)

Then, an irradiation step of irradiating a desired portion of the substrate with an ultraviolet laser was performed. This step will be explained in detail below. In this step, the ultraviolet laser was emitted by using the irradiation apparatus described previously with reference to FIG. 2. LPX-Pro305 manufactured by COHERENT was used as the ArF excimer laser oscillator 1. The ArF excimer laser oscillator 1 emitted a laser having a wavelength of 193 nm. The beam size 8a had an area of (V×H=12 mm×30 mm). In the generation of a laser beam, it is possible to generate pulse energy to a maximum of 600 $mJ/cm^2$. In this embodiment, however, a ×12 reduction lens was used midway along an optical system, so it was possible to apply pulse energy at a higher density to the irradiation portion of the resin material. The output was appropriately adjusted so that the energy density on the irradiation surface became a desired energy density. Synthetic quartz was used as the substrate 10 of the photomask 4, and a chromium film was used as the light-shielding member 10a.

Details of the ultraviolet laser used in this example were as follows.

Ultraviolet Laser:
  ArF excimer laser (main wavelength=193 nm)
Ultraviolet Laser Irradiation Apparatus:
  LPXpro 305 manufactured by COHERENT
Irradiation Conditions:
  frequency=50 Hz, pulse width=25 ns
Irradiation Surface Energy Density Per Pulse:
  100 mJ/cm$^2$ FIGS. 5A to 5D show the results of analysis performed by XPS measurement on the surface modification status of the substrate irradiated with the ultraviolet light as described above. As will be explained below, the modification progress status is found by comparing FIGS. 5A and 5B or FIGS. 5C and 5D.

Figure 5A:
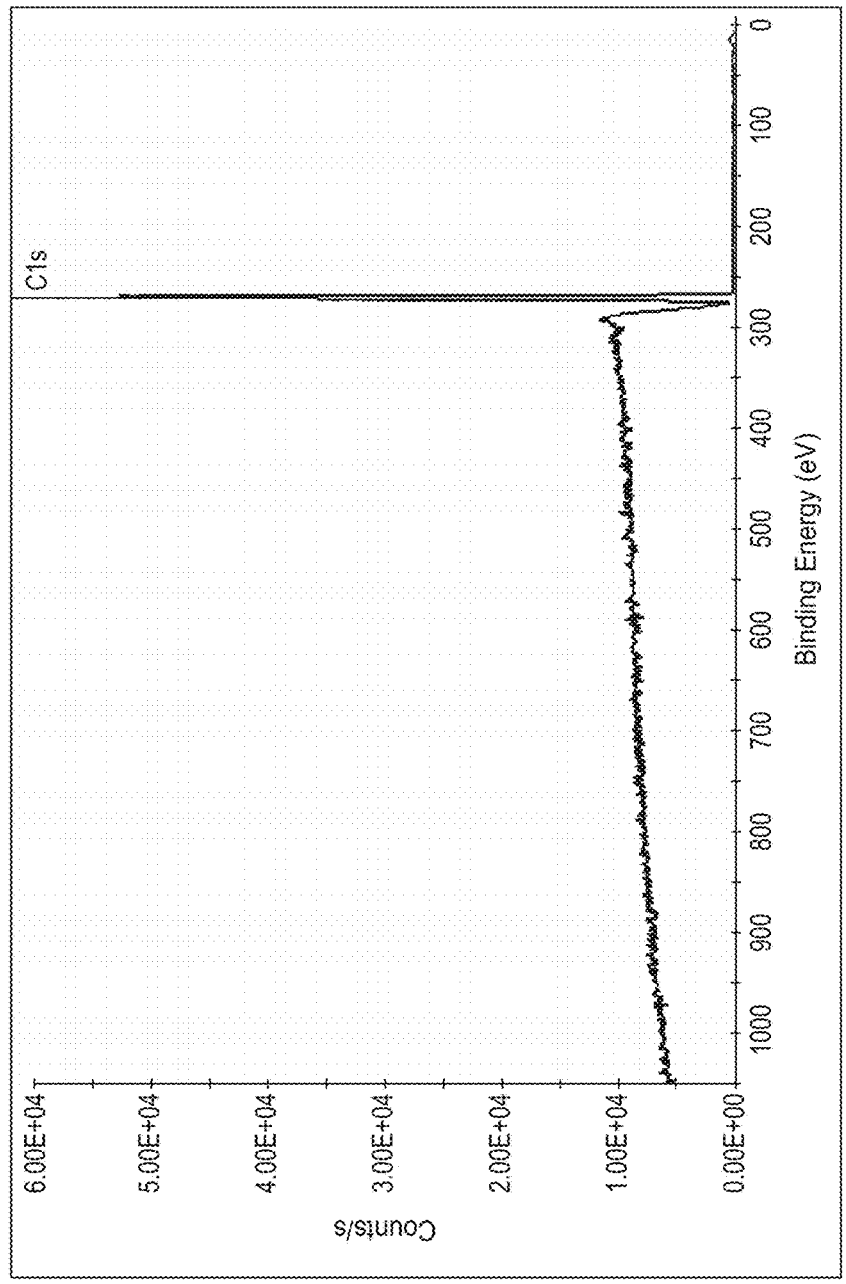
FIG. 5A is a view showing the XPS measurement result of a resin product surface before being modified by the ultraviolet laser.

FIG. 5A is an XPS qualitative spectrum of the cycloolefin polymer material before modification. As shown in FIG. 5A, only the peak of carbon atoms was detected. FIG. 5C is a composition spectrum of the cycloolefin polymer material before modification. As shown in FIG. 5C, only peaks indicating carbon bonds were detected.

Figure 5B:
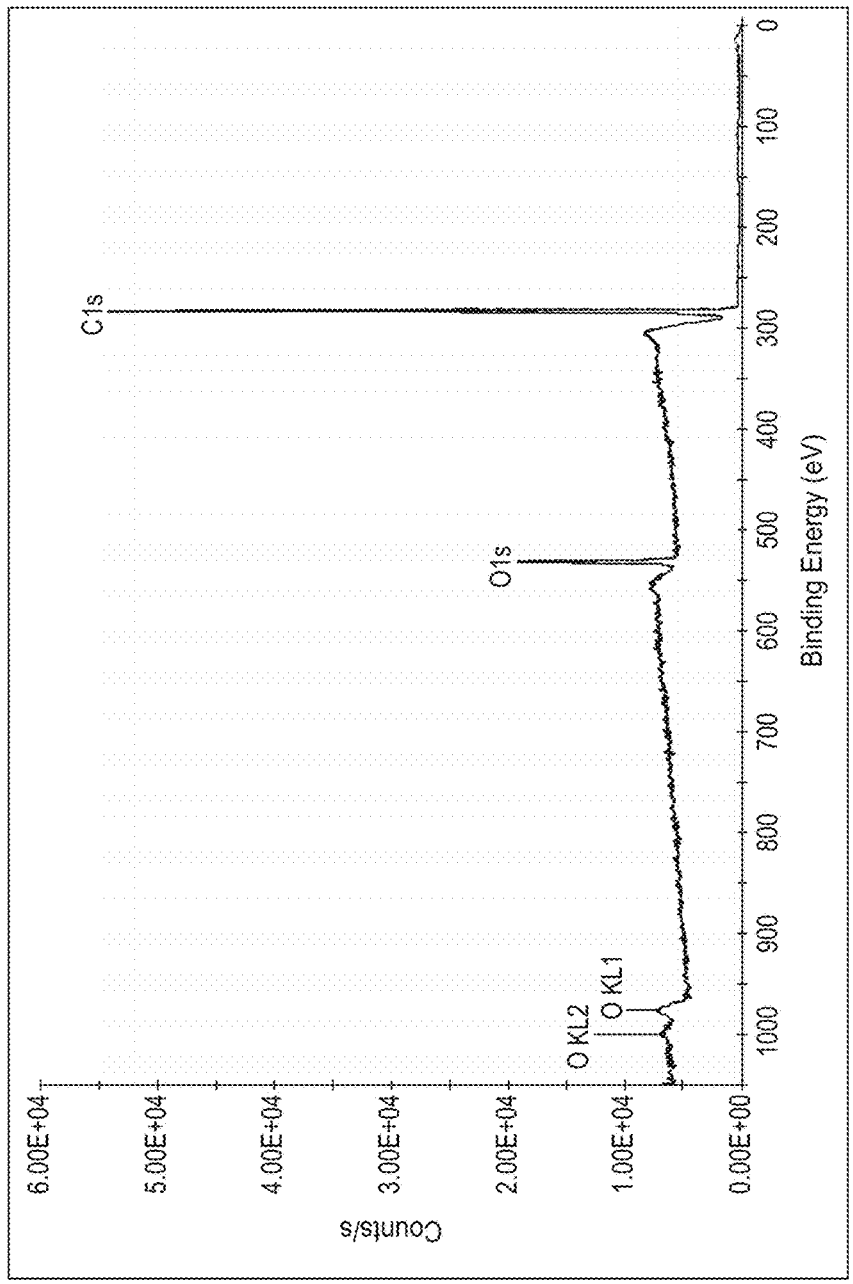
FIG. 5B is a view showing the XPS measurement result of the resin product surface after being modified by the ultraviolet laser.
Figure 5C:
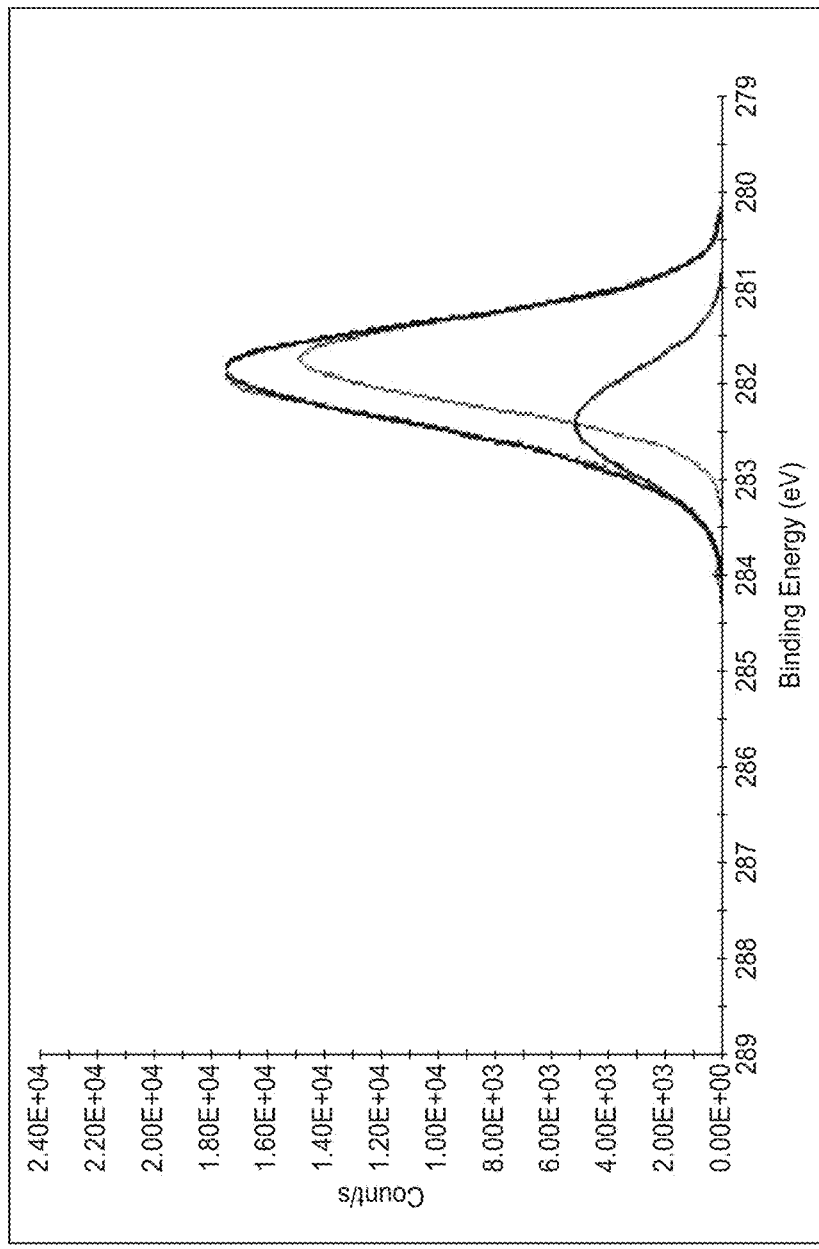
FIG. 5C is a view showing the XPS measurement result of the resin product surface before being modified by the ultraviolet laser.

On the other hand, FIG. 5B is an XPS qualitative spectrum after the cycloolefin polymer material was irradiated with 200 pulses of the ArF excimer laser. As shown in FIG. 5B, the peak of oxygen atoms was detected, and the oxygen atom existence ratio was 8.8% as shown in Table 6. The XPS measurement apparatus was unable to measure a hydrogen atom. Accordingly, the atom existence ratio on the cycloolefin polymer material surface in this example was calculated based on only carbon atoms and oxygen atoms. FIG. 5D is a composition spectrum after the cycloolefin polymer material was irradiated with 200 pulses of the ArF excimer laser. As shown in FIG. 5D, C—O bonds and C=O bonds were detected, that is, surface modification was performed.

TABLE 6

| Ultraviolet Laser Irradiation Conditions | Oxygen Existence Ratio (%) |
|---|---|
| Not Irradiated | 0 |
| 200 pulses | 8.8 |

Figure 6:
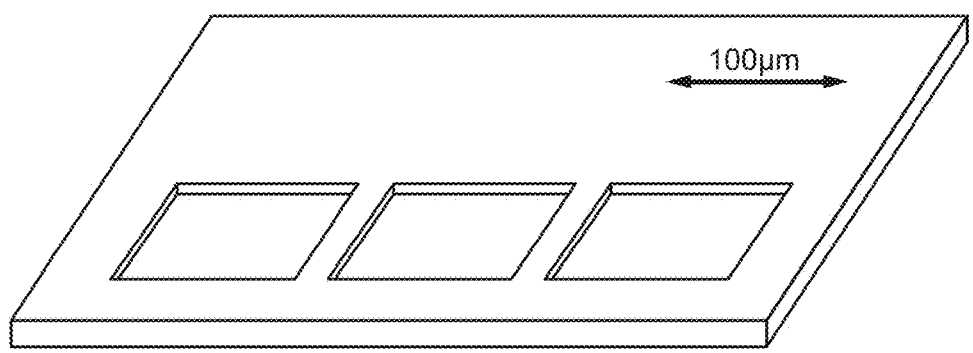
FIG. 6 is a view showing the shape of a portion irradiated with the ultraviolet laser.

FIG. 6 shows the shape of the substrate surface confirmed by using an SEM (Scanning Electron Microscope) after the cycloolefin polymer material was irradiated with 200 pulses of the ArF excimer laser. As shown in FIG. 6, recesses were formed in the laser-irradiated portion. The depth of the recesses was about 0.2 μm. Also, it was possible to adjust the depth by increasing or decreasing the number of laser pulses. In addition, as shown in FIG. 6, it was possible to accurately form recesses, that is, modified portions corresponding to a desired pattern formed on the photomask 4. This was so probably because misalignment hardly occurred between the photomask and substrate due to thermal expansion because the laser irradiation time was short.

(Oxidation Step)

Subsequently, an oxidation step in which the desired portion of the substrate irradiated with the laser was irradiated with an ultraviolet lamp was performed. This step will be explained in detail below. In this step, ultraviolet light was emitted in the atmosphere by using the ultraviolet irradiation apparatus including the ultraviolet lamp described above with reference to FIG. 7. Details of the ultraviolet lamp (low-pressure mercury lamp) used in this example were as follows.

Low-Pressure Mercury Lamp:
  UV-300 (main wavelength=185 nm, 254 nm) manufactured by SAMCO
Illumination at Irradiation Distance of 3.5 cm:
  5.40 mW/cm$^2$ (254 nm)
  1.35 mW/cm$^2$ (185 nm)

Figure 8A:
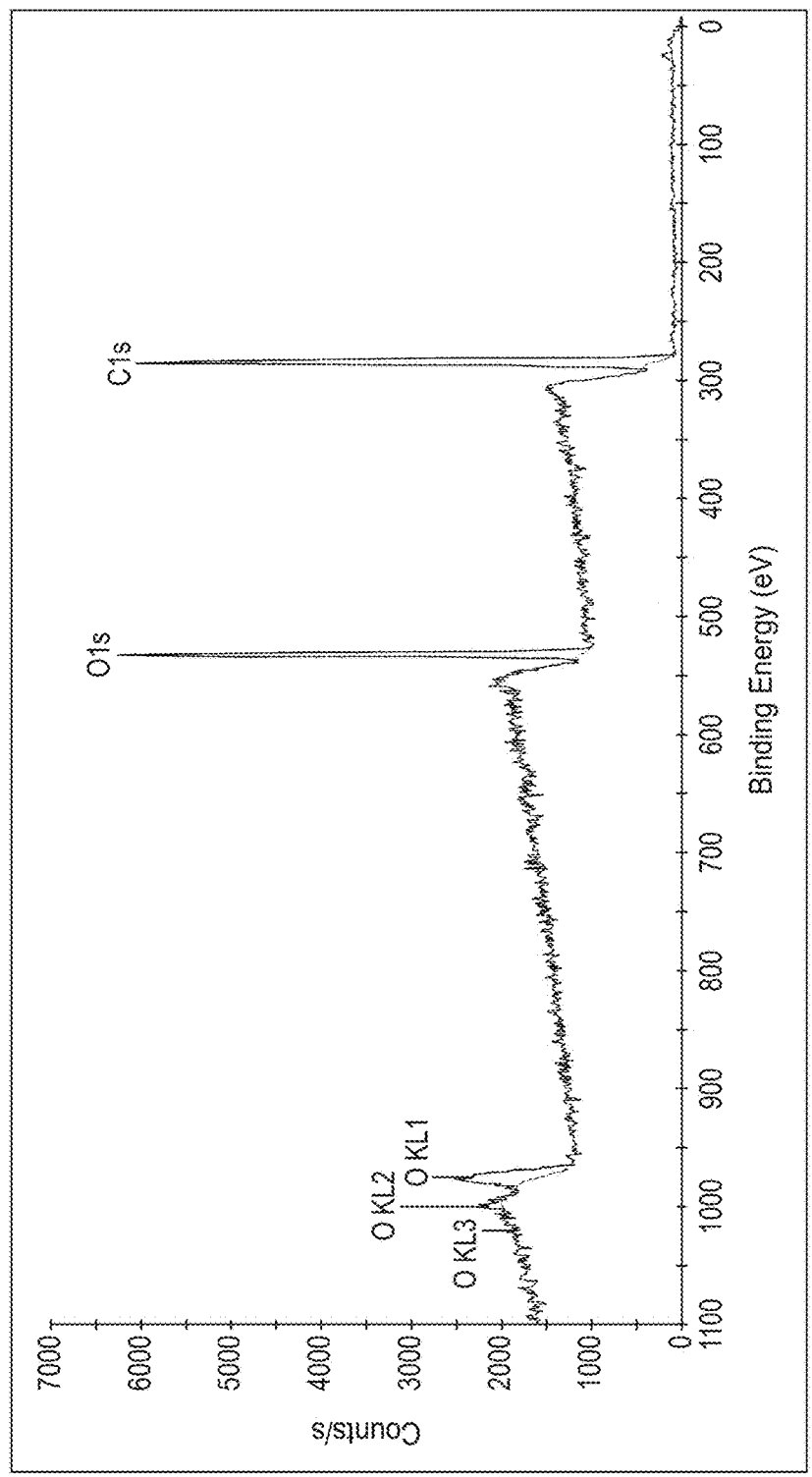
FIG. 8A is a view showing the XPS measurement result of a resin product surface after the laser-irradiated portion is additionally irradiated with an ultraviolet lamp.

More specifically, the substrate after the cycloolefin polymer material was irradiated with 200 pulses of the ArF excimer laser was further irradiated with 1.35-mW/cm$^2$ (185-nm) ultraviolet light by using the above-mentioned ultraviolet lamp for 1 min at a distance of 3.5 cm from the ultraviolet lamp. In this case, the cumulative exposure amount was 1.35 mW/cm$^2$×60 sec=81 mJ/cm$^2$. The surface modification status of the substrate thus irradiated with the ultraviolet light was analyzed by XPS measurement. FIG. 8A shows the qualitative spectrum of the laser-irradiated portion on the substrate after the portion was irradiated with the ultraviolet lamp. As shown in FIG. 8A, the peak of oxygen atoms increased. As shown in Table 7, the oxygen atom existence ratio was 20.1%. Also, FIG. 8B shows the composition spectrum of the laser-irradiated portion on the substrate after the portion was irradiated with the ultraviolet lamp. When compared to FIG. 5D, the peaks of C—O bonds and C=O bonds increased, that is, surface modification further progressed.

TABLE 7

| Ultraviolet Lamp Modification Conditions | Oxygen Existence Ratio (%) |
|---|---|
| Before Irradiation | 8.8 |
| 81 mJ/cm$^2$ (185 nm) | 20.1 |

Furthermore, the oxygen atom existence ratio of the portion on the substrate, which was not irradiated with the laser, was analyzed by XPS measurement after the portion was irradiated with the ultraviolet lamp. FIG. 9A shows the qualitative spectrum of the portion on the substrate, which was not irradiated with the laser, after the portion was irradiated with the ultraviolet lamp. As shown in FIG. 9A, the peak of oxygen atoms increased. As shown in Table 8, the oxygen atom existence ratio was 12.6%. Also, FIG. 9B shows the composition spectrum of the portion on the substrate, which was not irradiated with the laser, after the portion was irradiated with the ultraviolet lamp. When compared to FIG. 5C, the peaks of C—O bonds and C=O bonds increased, that is, surface modification progressed. However, the surface modification amount was smaller than that in the laser-irradiated portion. In this example as described above, the oxygen atom existence ratio was suppressed to 15% or less in the portion on the substrate, which was not irradiated with the laser. As will be described later, therefore, it was possible to selectively deposit a plating metal in the laser-irradiated portion.

TABLE 8

| Ultraviolet Lamp Modification Conditions | Oxygen Existence Ratio (%) |
|---|---|
| 81 mJ/cm$^2$ (185 nm) | 12.6 |

(Plating Step)

Then, a plating step of performing electroless plating on the substrate irradiated with the ultraviolet light in the oxidation step was performed. As an electroless plating solution, Cu—Ni plating solution set "AISL" manufactured by JCU was used. Table 9 shows practical processes in the plating step.

TABLE 9

| Step | Processing Conditions | Remarks |
|---|---|---|
| Alkali Processing | 50° C., 2 min | Degreasing and Wettability Improved |
| Water Washing + Drying (Air Blow) | | |
| Conditioner Step | 50° C., 2 min | Binder between Catalyst Ions and Substrate Was Deposited |
| Hot Water Washing + Water Washing + Drying (Air Blow) | | |
| Activator | 50° C., 2 min | Catalyst Ions Were Deposited |
| Water Washing + Drying (Air Blow) | | |
| Accelerator | 40° C., 2 min | Metal Was Formed by Reducing Catalyst Ions |
| Water Washing + Drying (Air Blow) | | |
| Electroless Cu—Ni Plating | 60° C., 5 min | Electroless Plating Metal Was Deposited |
| Water Washing + Drying (Air Blow) | | |

Figure 10:
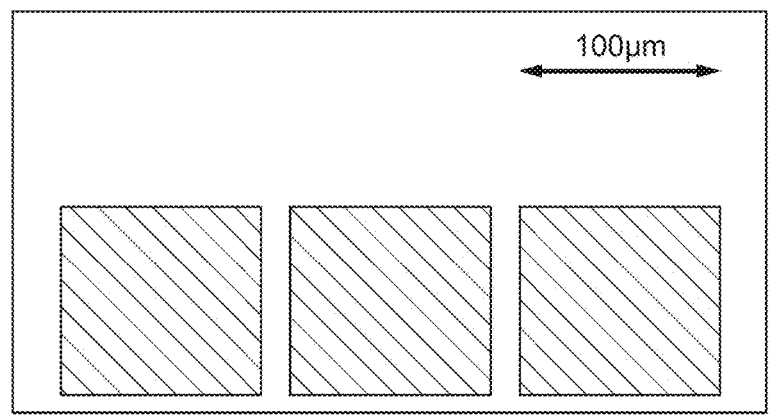
FIG. 10 is a view showing the shape of a deposited electroless plating metal.

When electroless plating was performed in accordance with the steps shown in Table 9, a metal film was formed in only the laser-irradiated portion by electroless plating. FIG. 10 shows the shape of the obtained substrate observed with an SEM. As shown in FIG. 10, the surface of the metal film was smooth.

Example 2

An irradiation step, oxidation step, and plating step were performed following the same procedures as in Example 1 except that the number of times of laser irradiation was changed in the irradiation step, and whether a metal film was formed in the laser-irradiated portion was observed. Table 10 shows the results. In Table 10, ○ indicates that a plating metal was deposited, and x indicates that no plating metal was deposited.

TABLE 10

| Oxygen Atom Existence Ratio after Laser Irradiation | Cumulative Irradiation Amount in Oxidation Step 81 mJ/cm$^2$ (1-min Irradiation) |
|---|---|
| 0.0% | x |
| 3.8% | x |
| 4.2% | x |
| 7.1% | ○ |
| 8.8% | ○ |

As shown in Table 10, when 81 mJ/cm$^2$ ultraviolet light was emitted in the oxidation step, a plating metal was deposited on the laser-irradiated portion by setting the oxygen atom existence ratio in the laser-irradiated portion at 6.5% or more in the irradiation step. More specifically, the oxygen atom existence ratio was 6.5% or more when the number of pulses was 20 or more in this example in which the ArF excimer laser having an energy density of 100 mJ/cm$^2$ was emitted. Since it is conceivable that the oxygen atom existence ratio does not decrease even when the number of pulses is increased, the number of pulses presumably has no upper limit. However, the oxygen atom existence ratio was 6.5% or more when the number of pulses was 200 or less.

Example 3

An irradiation step, oxidation step, and plating step were performed following the same procedures as in Example 1 except that the number of times of laser irradiation was changed in the irradiation step, and ultraviolet light was emitted for 3 min in the oxidation step, and whether a metal film was formed in the laser-irradiated portion was observed. Table 11 shows the results. In Table 11, ○ indicates that a plating metal was deposited, and x indicates that no plating metal was deposited.

TABLE 11

| Oxygen Atom Existence Ratio after Laser Irradiation | Cumulative Irradiation Amount in Oxidation Step 243 mJ/cm$^2$ (3-min Irradiation) |
|---|---|
| 0.0% | x |
| 3.8% | ○ |
| 4.2% | ○ |
| 7.1% | ○ |
| 8.8% | ○ |

As shown in Table 11, when 243 mJ/cm$^2$ ultraviolet light was emitted in the oxidation step, a plating metal was deposited in the laser-irradiated portion by setting the oxygen atom existence ratio in the laser-irradiated portion at 3.0% or more in the irradiation step.

Example 4

Figure 11:
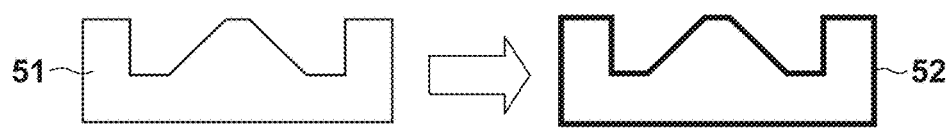
FIG. 11 is a view for explaining the formation of a resin film in Example 4.

In Example 4, a metal three-dimensional object made of iron was used as a substrate to be plated. First, as shown in FIG. 11, a metal three-dimensional object 51 was dipped in a solution obtained by dissolving a cycloolefin polymer material (Zeonor Film ZF-16 manufactured by ZEON, film thickness=100 μm, and surface roughness=1.01 nm) in an organic solvent, and cured by drying, thereby forming a cycloolefin polymer film as a resin coating 52 of the metal three-dimensional object 51.

Figure 12:
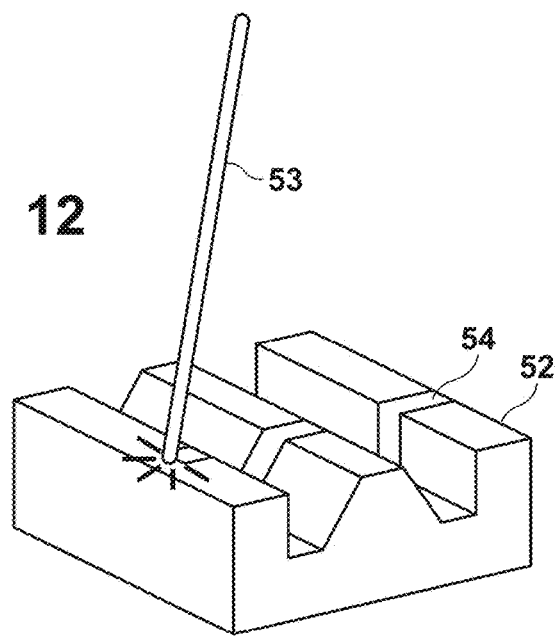
FIG. 12 is a view for explaining ultraviolet laser irradiation in Example 4.

After that, as shown in FIG. 12, a desired portion 54 as a plating metal deposition target on the surface of the coating 52 was scanned with an ArF excimer laser 53 (wavelength=193 nm) as an ultraviolet laser. The ultraviolet laser used was as follows.

Ultraviolet Laser:
  ArF excimer laser (main wavelength=193 nm)
Ultraviolet Laser Irradiation Apparatus:
  LPXpro 305 manufactured by COHERENT
Irradiation Conditions:
  frequency=2 Hz, pulse width=25 ns
Irradiation Surface Energy Density Per Pulse:
  1,000 mJ/cm$^2$ The irradiation was performed such that the cumulative irradiation amount was 2,000 mJ/cm$^2$. As described earlier, even when the cumulative exposure amount becomes tenfold, that is, 20,000 mJ/cm², the surface modification amount remains almost the same if the energy density is the same. On the other hand, the depth of a recess increases when the cumulative exposure amount increases.

Figure 13:
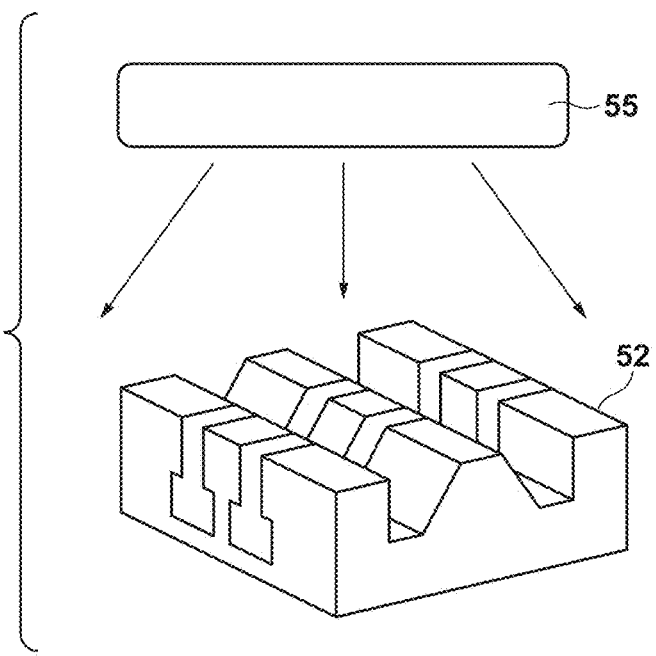
FIG. 13 is a view for explaining ultraviolet lamp irradiation in Example 4.

Then, as shown in FIG. 13, a portion including the laser-irradiated portion of the coating 52 was irradiated with ultraviolet light from a low-pressure mercury lamp 55 for 3 min. The irradiation conditions used were as follows.

Low-Pressure Mercury Lamp:
UV-300 (main wavelength=185 nm, 254 nm) manufactured by SAMCO Illumination at Irradiation Distance of 3.5 cm:
5.40 mW/cm² (254 nm)
1.35 mW/cm² (185 nm)

Subsequently, electroless plating was performed on a multilayered structure of the metal three-dimensional object 51 and coating 52. As an electroless plating solution, Cu—Ni plating solution set "AISL" manufactured by JCU was used. Details of this electroless plating step were the same as those of the plating step in Example 1.

Figure 14:
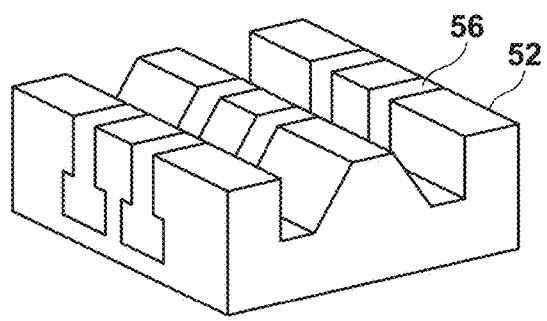
FIG. 14 is a view showing a three-dimensional circuit pattern formed in Example 4.

Consequently, of the metal three-dimensional object 51 coated with the coating 52, an electroless-plating metal film 56 was selectively formed in the portion modified by laser scanning. Thus, a three-dimensional circuit pattern was formed as shown in FIG. 14.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-167026, filed Aug. 9, 2013, and No. 2014-062695, filed Mar. 25, 2014, which are hereby incorporated by reference herein in their entirety.

What is claimed is:

1. A method for processing a resin product, the method comprising:
    irradiating a portion of a surface of the resin product with an ultraviolet laser beam to modify the portion; and
    after the irradiating, oxidizing a region including the portion to further modify the portion such that a plating metal can be deposited on the portion.

2. The method according to claim 1, wherein the portion is irradiated with the ultraviolet laser beam having a wavelength of not more than 243 nm.

3. The method according to claim 1, wherein the portion is irradiated with the ultraviolet light laser beam in an atmosphere containing at least one of oxygen or ozone.

4. The method according to claim 1, wherein oxidizing the region includes irradiating the region with ultraviolet light having a wavelength of not more than 243 nm.

5. The method according to claim 4, wherein the portion is irradiated with the ultraviolet light laser beam in an atmosphere containing at least one of oxygen or ozone, and the region is irradiated with the ultraviolet light in an atmosphere containing at least one of oxygen or ozone.

6. The method according to claim 1, wherein the oxidized region includes the irradiated portion and is wider than the irradiated portion.

7. The method according to claim 1, wherein an oxygen atom existence ratio in the portion is not less than 3.0% after the irradiating.

8. The method according to claim 1, wherein an oxygen atom existence ratio in the portion is not less than 18% after the irradiating and oxidizing.

9. The method according to claim 1, wherein the resin product has a resin coating.

10. The method according to claim 1, wherein the surface of the resin product contains a cycloolefin polymer.

11. The method according to claim 1, further comprising:
    plating the resin product on which the modification process is performed to manufacture a resin product with a metal film.

12. The method according to claim 11, wherein the plating metal is deposited on the portion on which the modification process is performed, and no plating metal is deposited on a portion adjacent to the portion on which the modification process is performed.

13. A method for processing a resin product, comprising:
    irradiating a portion of a surface of the resin product with an ultraviolet laser beam having a wavelength of not more than 243 nm; and
    after the irradiating, oxidizing a region including the portion to modify the portion such that a plating metal can be deposited on the portion.

14. The method according to claim 11, further comprising manufacturing a circuit board using the resin product with the metal film.

15. The method according to claim 11, wherein the plating includes depositing a metal film on a surface of one portion of the resin product which is recessed from a surface of another portion of the resin product adjacent to the one portion.

16. The method according to claim 1, further comprising changing a processing environment around the resin product from a first processing environment to a second processing environment, wherein the irradiating is performed in the first processing environment and the oxidizing is performed in the second processing environment.

17. The method according to claim 1,
    wherein, in the irradiating, the portion is irradiated with a first ultraviolet laser beam, and
    wherein, in the oxidizing, the region is irradiated with ultraviolet light having different energy than the first ultraviolet laser beam.

18. The method according to claim 1, wherein a degree of oxidation at the portion is increased by the irradiating, and a degree of oxidation at the region is increased by the oxidizing.

19. The method according to claim 1,
    wherein the irradiating includes irradiating a selected portion of the surface of the resin product in accordance with a fine plating pattern,
    wherein the oxidizing includes oxidizing the region that includes the selected portion and is larger than the selected portion, and
    wherein the fine plating pattern includes a wire pattern.

20. The method according to claim 1,
    wherein the irradiating includes irradiating the portion of the surface of the resin product with the ultraviolet laser beam having a wavelength of not more than 243 nm; and
    wherein the oxidizing includes irradiating the region including the portion with ultraviolet light having a wavelength of not more than 243 nm.

* * * * *